(12) United States Patent
Kageyama et al.

(10) Patent No.: US 7,728,722 B2
(45) Date of Patent: Jun. 1, 2010

(54) VEHICLE DISPLAY DEVICE

(75) Inventors: Hideaki Kageyama, Shizuoka (JP);
Yoshiyuki Furuya, Shizuoka (JP);
Hiroyuki Yokota, Shizuoka (JP);
Satoshi Saotome, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 342 days.

(21) Appl. No.: 11/878,816

(22) Filed: Jul. 27, 2007

(65) Prior Publication Data

US 2008/0024288 A1 Jan. 31, 2008

(30) Foreign Application Priority Data

Jul. 28, 2006 (JP) ............... 2006-205826
Apr. 26, 2007 (JP) ............... 2007-117367

(51) Int. Cl.
*G09F 9/00* (2006.01)
(52) U.S. Cl. ..................... 340/461
(58) Field of Classification Search ................ 340/461, 340/463, 466; 73/114.25, 526, 430, 866.3
See application file for complete search history.

(56) References Cited

U.S. PATENT DOCUMENTS

| 1,417,204 | A | * | 5/1922 | Riggs | 73/496 |
| 2,246,366 | A | * | 6/1941 | Kollsman | 73/496 |
| 2,619,933 | A | * | 12/1952 | Gordon, Jr. et al. | 116/328 |
| 3,240,072 | A | * | 3/1966 | Holbrook | 73/496 |
| 3,393,568 | A | * | 7/1968 | Marshall et al. | 73/496 |
| 3,580,085 | A | * | 5/1971 | Hitzelberger | 73/496 |
| 4,010,548 | A | * | 3/1977 | Iwasaki | 33/556 |
| 4,100,812 | A | * | 7/1978 | Gray et al. | 73/732 |
| 4,208,981 | A | * | 6/1980 | Coha et al. | 116/28.1 |
| 4,213,415 | A | * | 7/1980 | Coha et al. | 116/28.1 |
| 7,236,089 | B2 | * | 6/2007 | Ono et al. | 340/461 |
| 7,369,044 | B2 | * | 5/2008 | Ono et al. | 340/461 |
| 7,382,234 | B2 | * | 6/2008 | Yokota et al. | 340/425.5 |
| 7,586,404 | B2 | * | 9/2009 | Kageyama et al. | 340/461 |
| 2005/0212669 | A1 | * | 9/2005 | Ono et al. | 340/461 |

FOREIGN PATENT DOCUMENTS

| JP | 62-58112 | 3/1987 |
| JP | 11-248490 | 9/1999 |
| JP | 2005-241626 | 9/2005 |

\* cited by examiner

*Primary Examiner*—John Fitzgerald
(74) *Attorney, Agent, or Firm*—Kratz, Quintos & Hanson, LLP

(57) ABSTRACT

The object of the invention is to provide an improved vehicle display device that can avoid transmitting noise generated by vibration of a power source, as well as, can prevent the vibration of the power source from being transmitted into the other members or areas.

The afore-mentioned object can be achieved by a vehicle display device comprising a circular dial member positioned in front of a display field of a display, at least partly surrounding the display field, and traveling linearly across the display field in cases where a movable member connected thereto is driven by a power source, the power source being coupled to a support member through a damper.

10 Claims, 22 Drawing Sheets

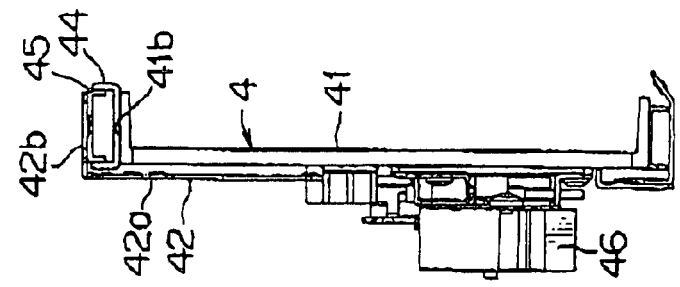
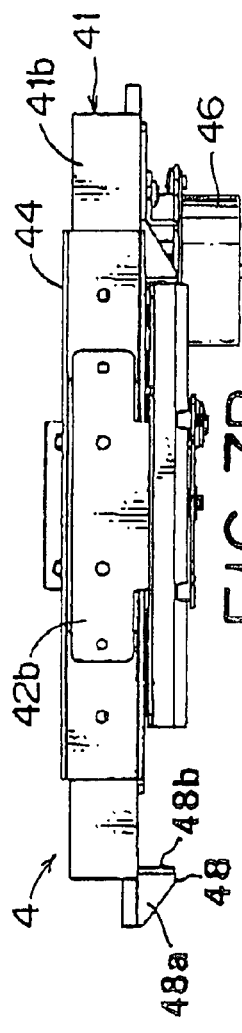
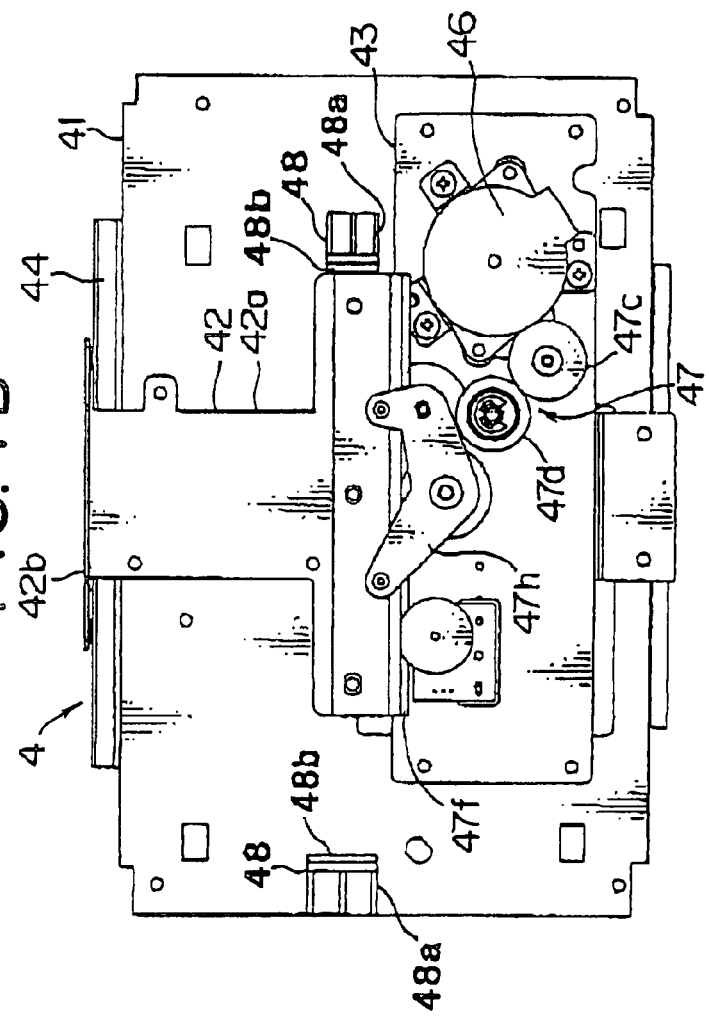
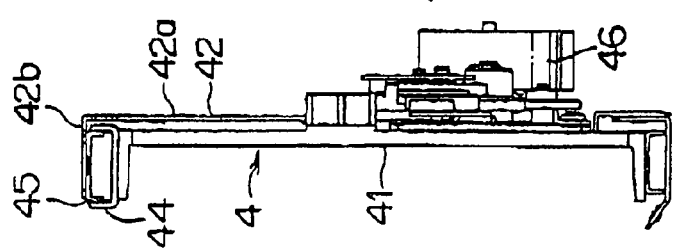

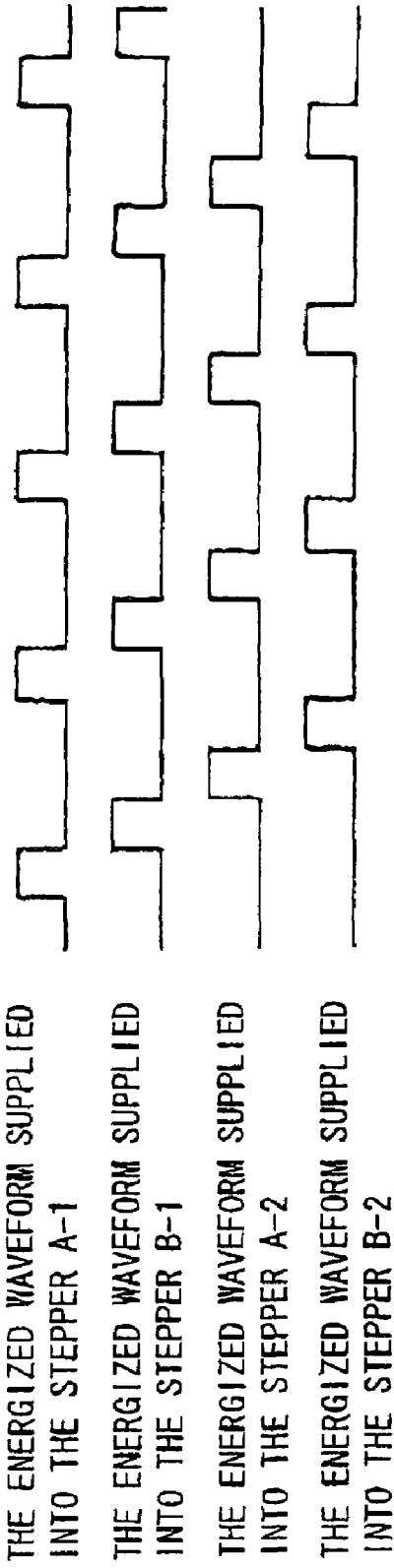

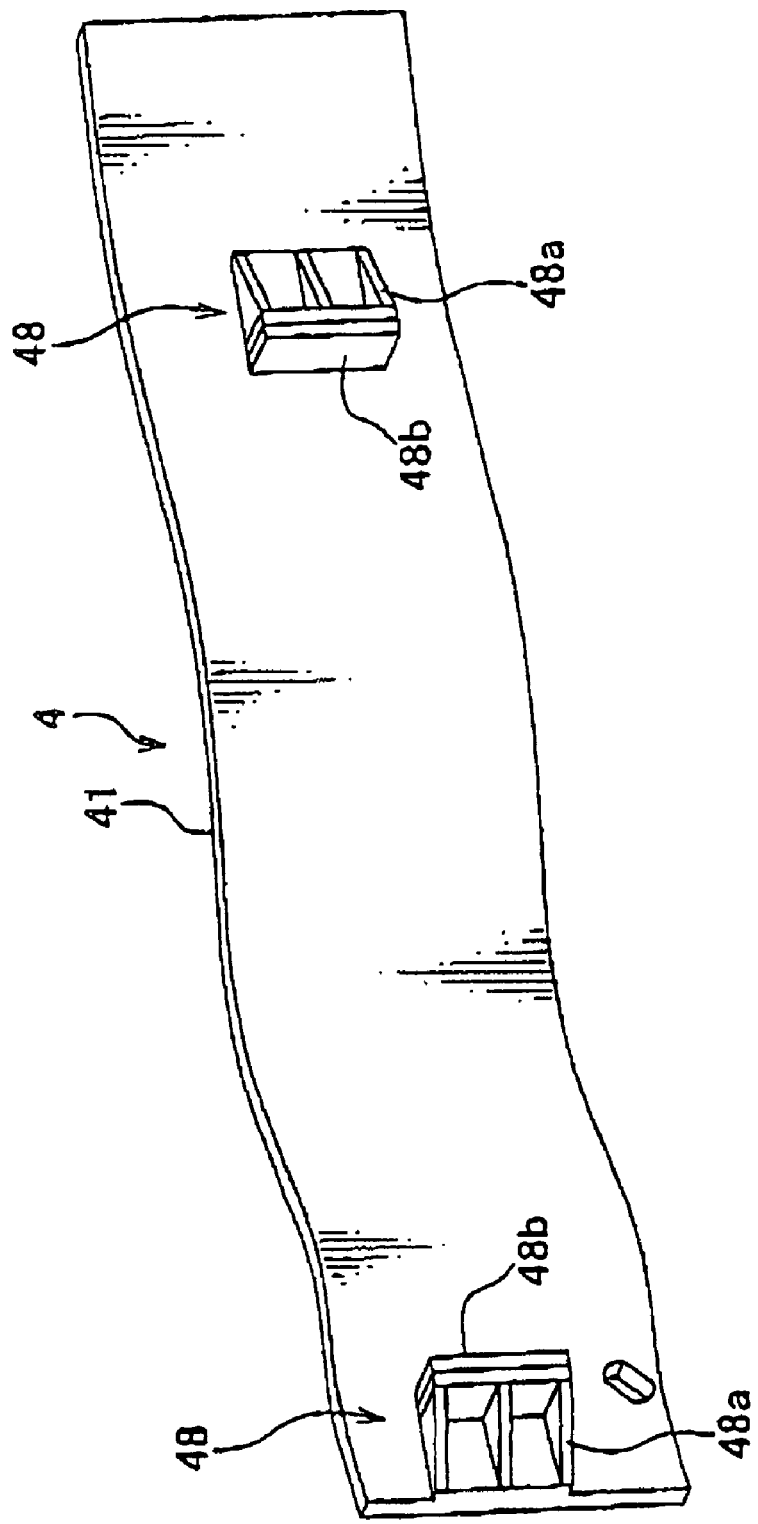

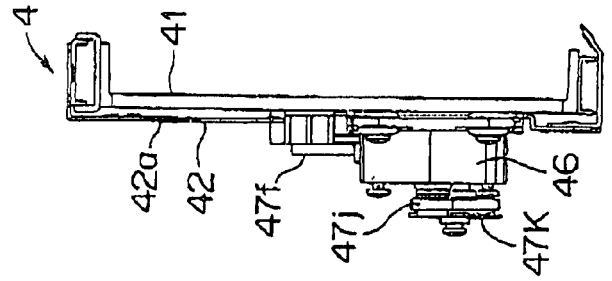
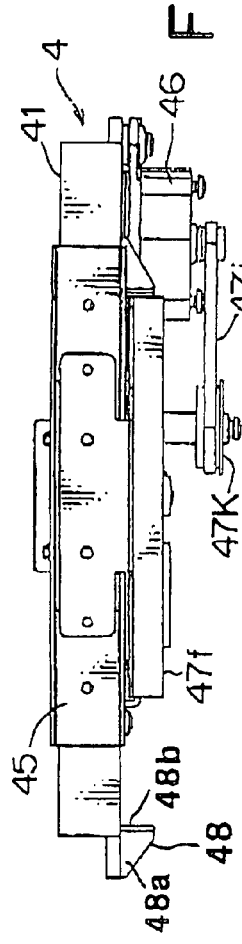
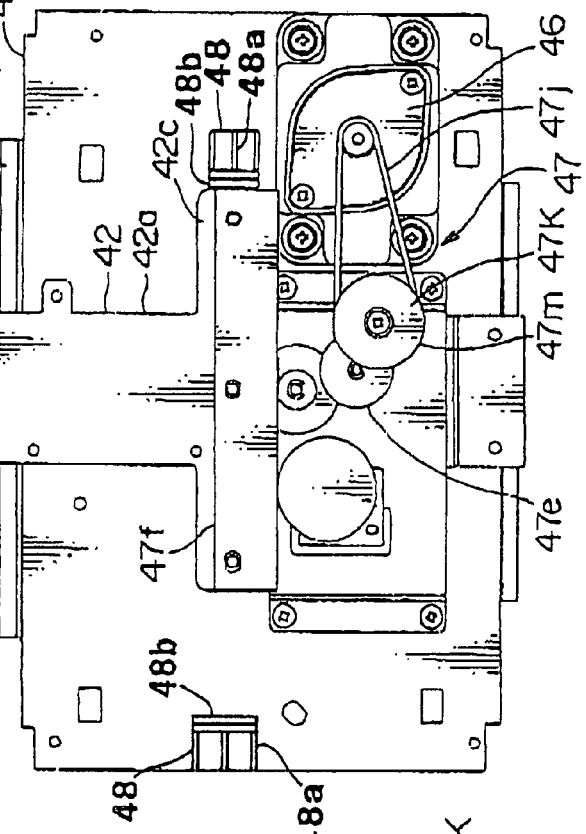
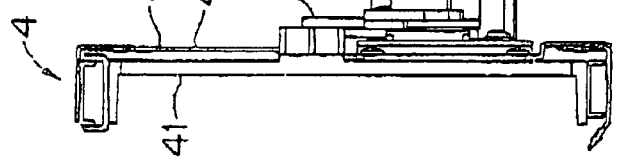

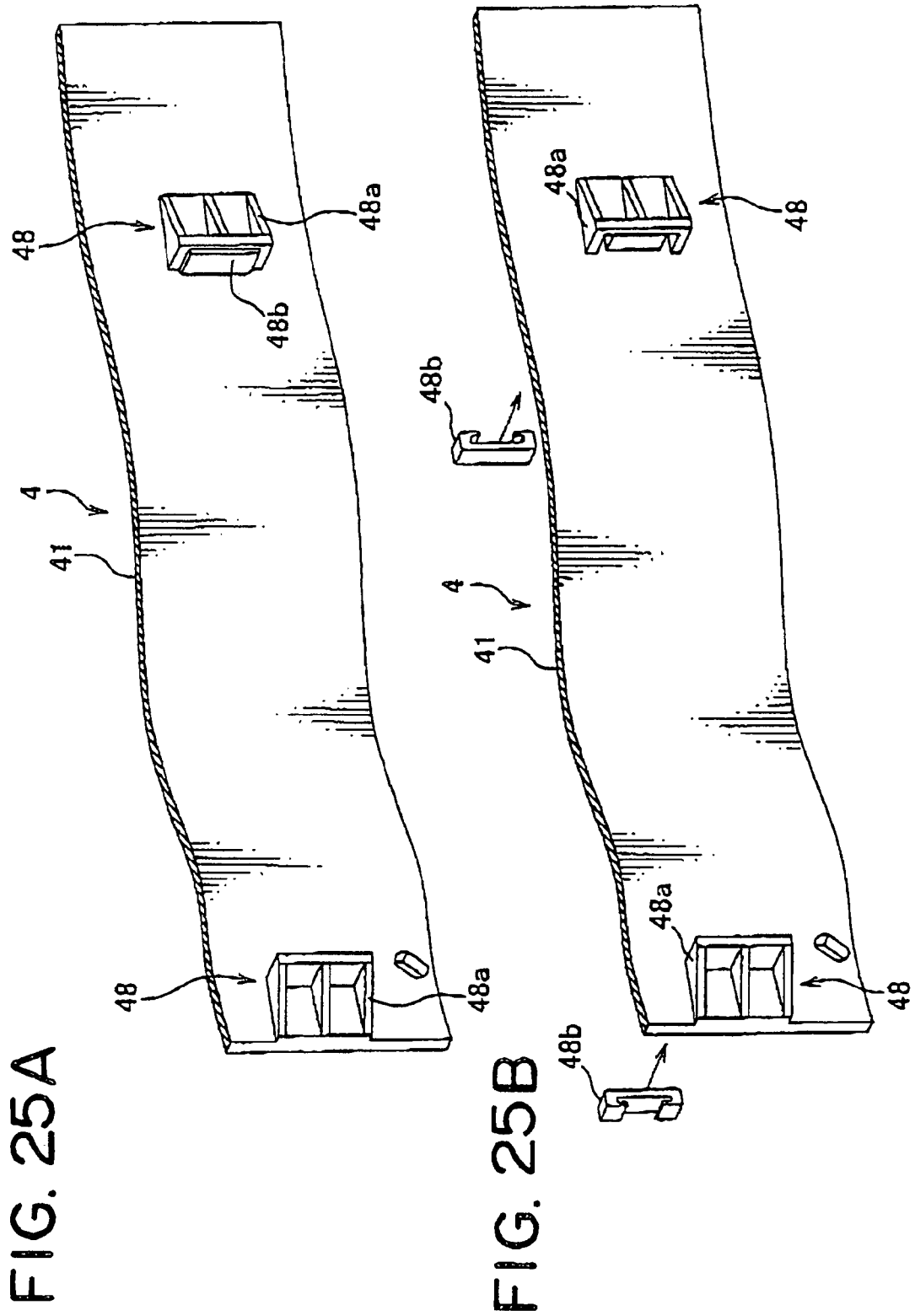

VEHICLE DISPLAY DEVICE

CROSS-REFERENCE TO RELATED APPLICATIONS

The present application claims priority to two Japanese Patent Applications No. 2006-205826 filed Jul. 28, 2006 and No. 2007-117367 filed Apr. 26, 2007, the entire disclosure of which, including the specification and drawings, is expressly incorporated herein by reference.

BACKGROUND OF THE INVENTION (1) Field of the Invention

The present invention relates to a vehicle display device.

(2) Description of the Related Art

While a combination meter for displaying a plurality of meters in a vehicle generally has employed a liquid crystal display for providing information in a form having a digital appearance to the vehicle operator regarding engine speed, fuel level, and an unlimited variety of other information which had been provided in traditional analogue form (see Japanese Patent Publications No. 62-58112 and No. H11-248490), it is a mere change in a displaying device. In this regard, there has been a drawback that the indication is not stereoscopic, but merely planer.

To solve the afore-mentioned problems, the present inventors have proposed a vehicle display device for visualizing a region surrounded by a circular partitioning member on the display field of a liquid crystal display, the circular partitioning member being positioned in front of the display field, and the circular partitioning member traveling linearly across the display field by the drive of the power source such as a motor. Due to such a partitioning member, more stereoscopic displays of indication can be achieved in comparison with conventional vehicle display devices (see Japanese Unexamined Patent Publication No. 2005-241626)

However, when the partitioning member travels across the display field of the liquid crystal display by the driving of power source such as a motor, the afore-mentioned construct inevitably takes undesired effects, for example, noise, vibrations and the like. Vibration of the power source and the noise caused by the vibration can also be transmitted into the circular partitioning member during the movement. In this case, the circular partitioning member will vibrate, thus providing a vehicle operator with inconvenience in connection with the recognition of information displayed on the display field of the liquid crystal display.

To solve the afore-mentioned drawbacks and disadvantages, the present inventors had focused on an improved vehicle display device that can avoid transmitting noise generated by vibration of the power source, as well as, can prevent the vibration of the power source from being transmitted into the circular partitioning member. Unexpectedly and surprisingly, the present inventors could attain to the afore-mentioned object by positioning the circular dial member in front of the display field of the display in such a manner that the circular dial member can travel linearly across the display field of the display and can surround at least a part of the display field. Further objects, features and advantages of the present invention will be explained in greater detail hereinafter.

SUMMARY OF THE INVENTION

According to one aspect of the present invention, there is provided a vehicle display device comprising a circular dial member positioned in front of a display field of a display, at least partly surrounding the display field, and traveling linearly across the display field in cases where a movable member connected to the circular dial member is driven by a power source, the power source being coupled to a support member through a damper.

Preferably, the vehicle display device can further include a transmission device coupled to the support member through the damper, and configured to transmit driving force generated by the power source into the movable member.

Preferably, the transmission device can be a gear-type one, and includes a helical gear to which the driving force is initially transmitted from the power source.

Preferably, the transmission device can comprise a rack and pinion set configured to convert turning of the power source into linear travel, and in turn to transmit the linear travel to the movable member. The rack meshes with a torque limiter having static frictional force of lower torque than turning torque of the power source.

Preferably, the damper can include a vibration damping steel plate.

Preferably, the damper can be made of synthetic resin-based material, and is sandwiched between a driving base on which the power source is mounted and the support member.

Preferably, the vehicle display device can comprise a display body having the display field, and a pair of radiators each being connected along an outer edge of the display body. Moreover, the vehicle display device can further include a front case positioned in front of the display, and a rear case positioned behind the power source, covering the display body together with the front case, and including a notch for passing the radiator therethrough, and a sealing member arranged along an peripheral edge of the notch and held in contact with the display body.

Preferably, the vehicle display device can further include a pair of stoppers each having a buffer and being able to come in contact with an interlocking member to control moving range of the movable member, the interlocking member traveling together with the movable member and being positioned between two stoppers.

Preferably, each of the stoppers includes a main body formed of synthetic resin-based material and the buffer formed of thermosetting elastomer-based material.

According to another aspect of the present invention, there is provided a vehicle display device. The vehicle display device, comprising circular dial member positioned in front of a display field of a display, at least partly surrounding the display field, and traveling linearly across the display field in cases where a movable member movably supported by a support member and connected to the circular dial member is driven by a power source, and a transmission device coupled to the support member, transmitting the driving force generated by the power source into the movable member, and comprising a belt to which the driving force is initially transmitted. In this construction, the power source is coupled to the support member through a buffer-containing damper, the buffer is sandwiched between the power source and the support member in cases where the power source is fixed to the support member.

BRIEF DESCRIPTION OF THE DRAWINGS

FIG. 7A is a plan view of the moving instrument of the vehicle display device of FIG. 6.

FIG. 7B is a front view of the moving instrument of the vehicle display device of FIG. 6.

FIG. 7C is a left side view of the moving instrument of the vehicle display device of FIG. 6.

FIG. 7D is a right side view of the moving instrument of the vehicle display device of FIG. 6.

FIG. 12 is a view for illustrating the energized waveform supplied into the stator of the motor of FIG. 11.

FIG. 14 is a side view of a stopper of the vehicle display device of FIG. 6.

FIG. 20A is a plan view of the moving instrument of the vehicle display device of FIG. 16.

FIG. 20B is a front view of the moving instrument of the vehicle display device of FIG. 16.

FIG. 20C is a left side view of the moving instrument of the vehicle display device of FIG. 16.

FIG. 20D is a right side view of the moving instrument of the vehicle display device of FIG. 16.

FIG. 25A is a side view of a modification of the stopper of the vehicle display device of FIG. 14.

FIG. 25B is an exploded view of a modification of the stopper of the vehicle display device of FIG. 14.

Figure 1:
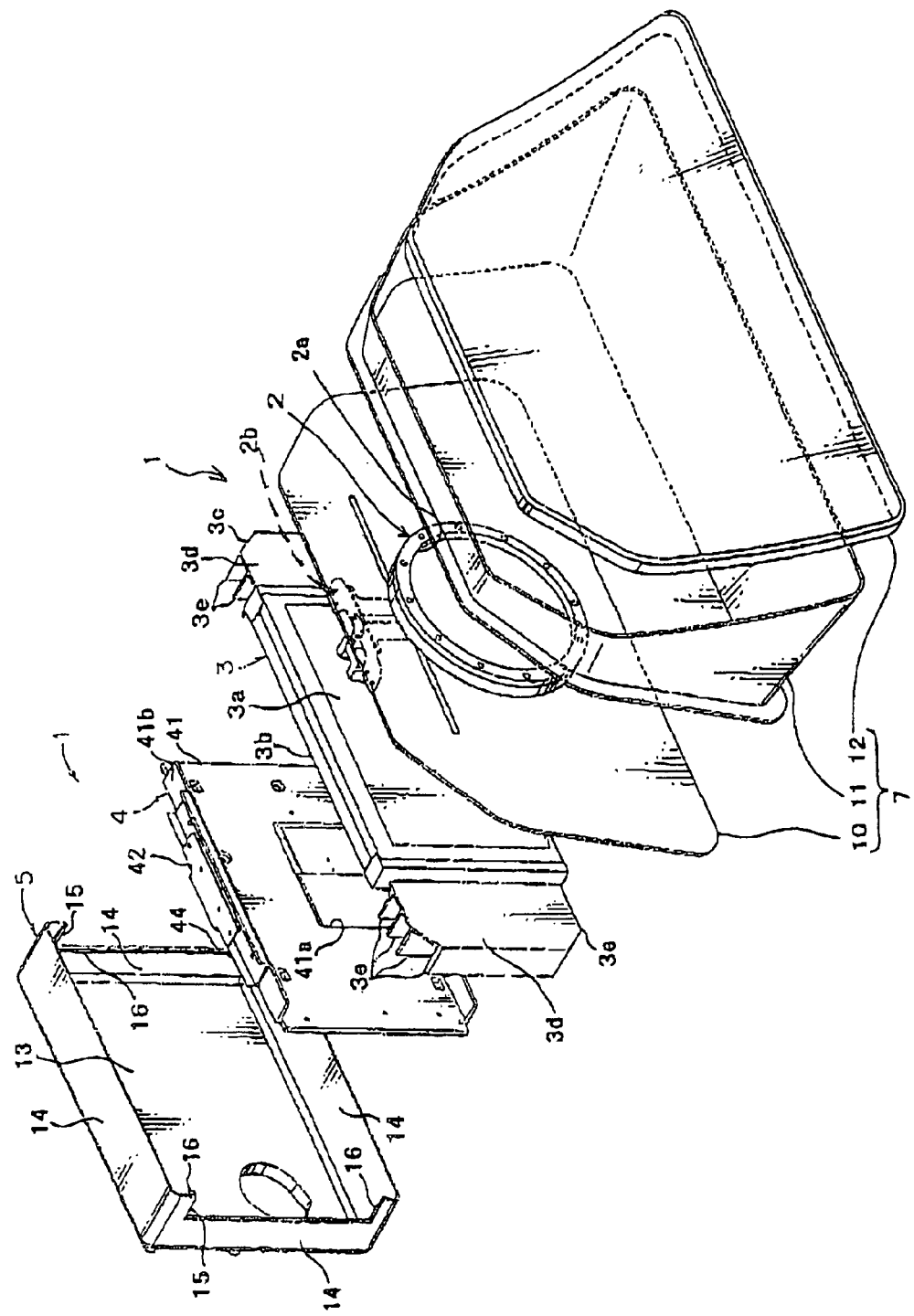
FIG. 1 is an exploded side view of the front of a vehicle display device in accordance with an exemplary embodiment of the invention.

The foregoing summary, as well as the following detailed description of certain embodiments of the present invention, will be better understood when read in conjunction with the appended FIGS. 1 to 25. For the purpose of illustrating the invention, there is shown in the drawings, certain embodiments. It should be understood, however, that the present invention is by no means limited by the appended drawings.

DESCRIPTION OF THE PREFERRED EMBODIMENTS

There are largely provided two embodiments of the vehicle display device in accordance with the present invention.

(The First Embodiment of the Vehicle Display Device in Accordance with the Present Invention)

Figure 2:
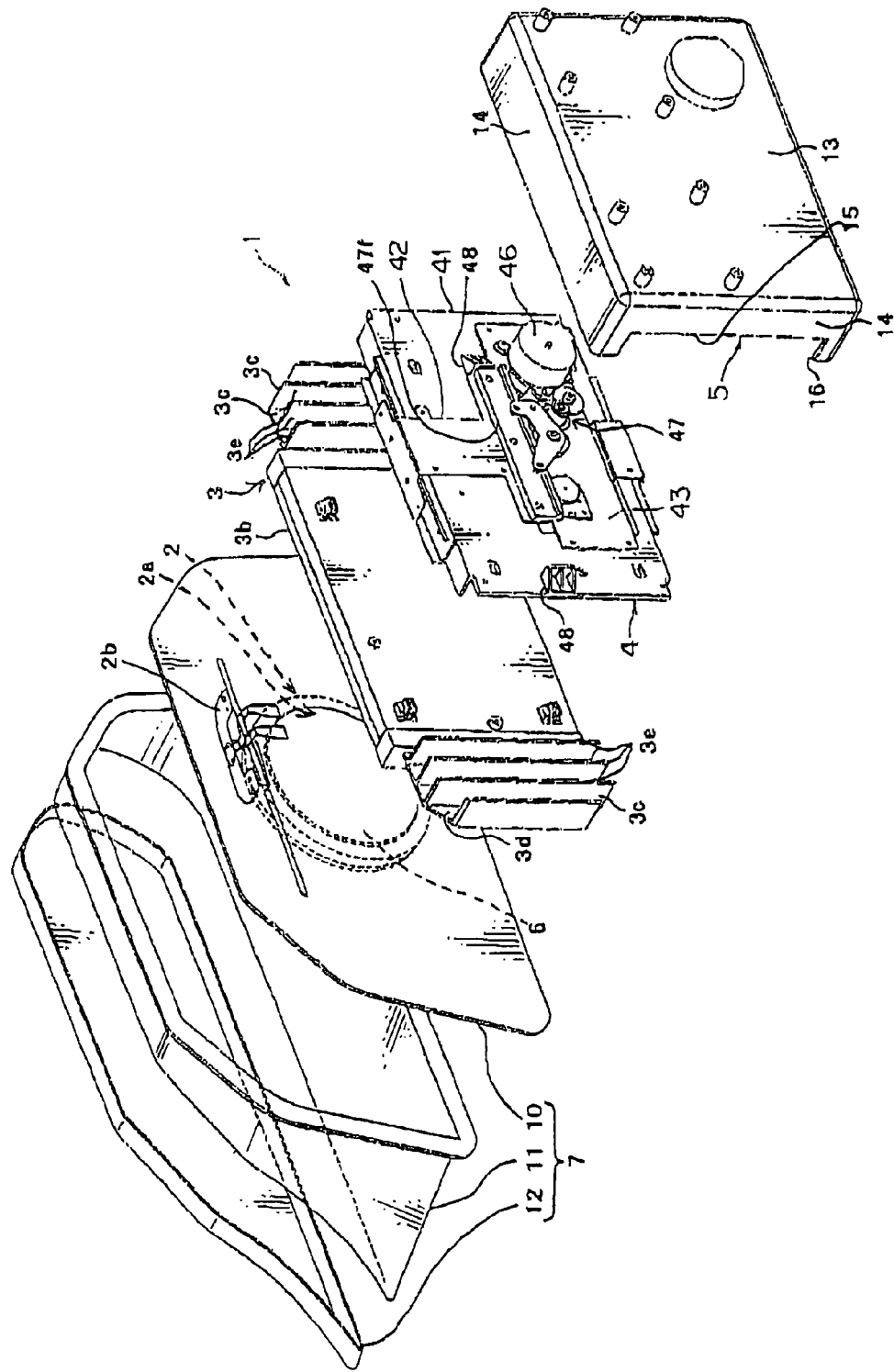
FIG. 2 is an exploded side view of the back of the vehicle display device of FIG. 1.
Figure 3:
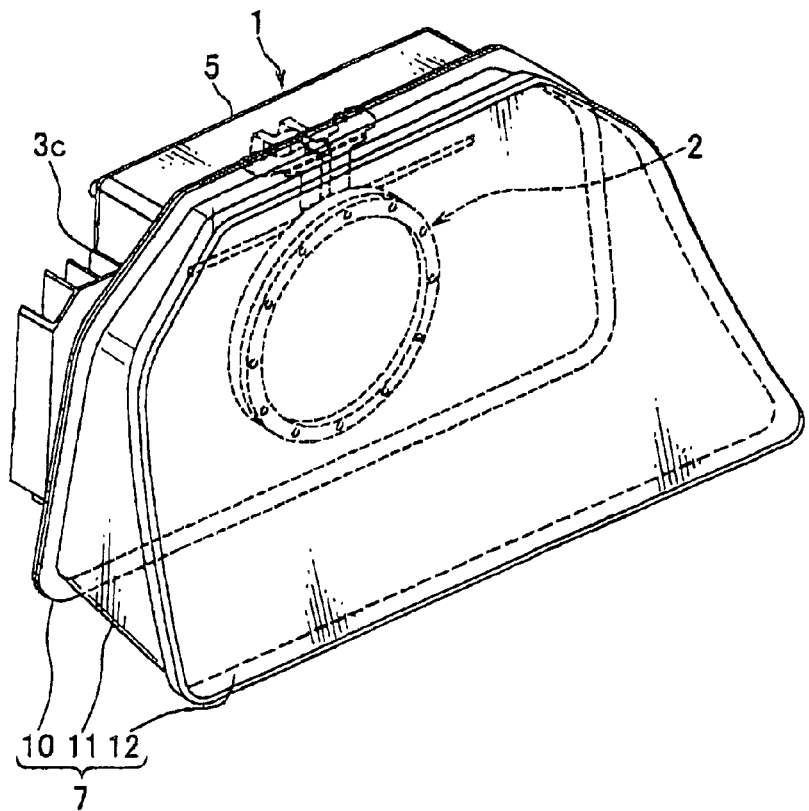
FIG. 3 is a side view of the front of vehicle display device of FIG. 1.
Figure 4:
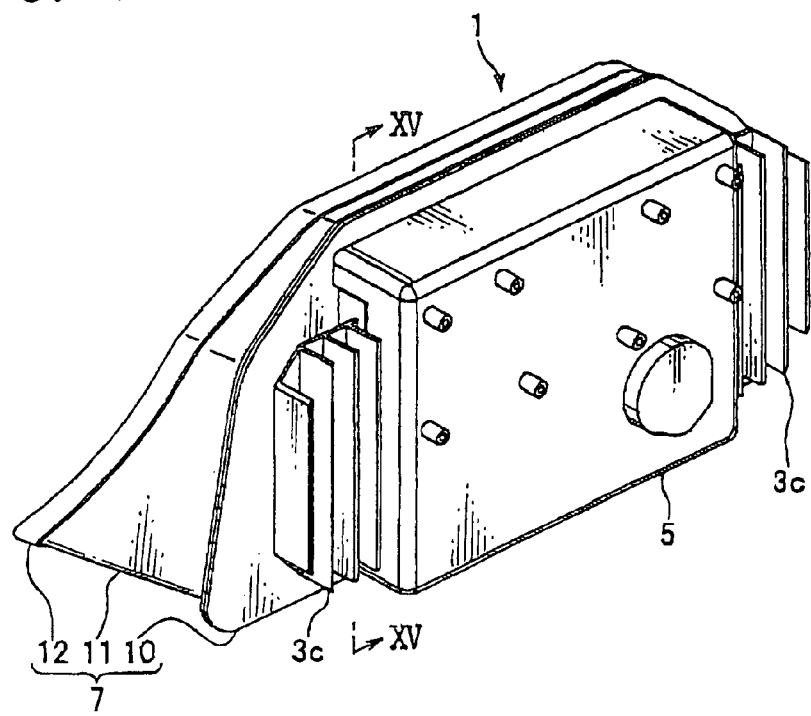
FIG. 4 is a side view of the back of the vehicle display device of FIG. 1.
Figure 5:
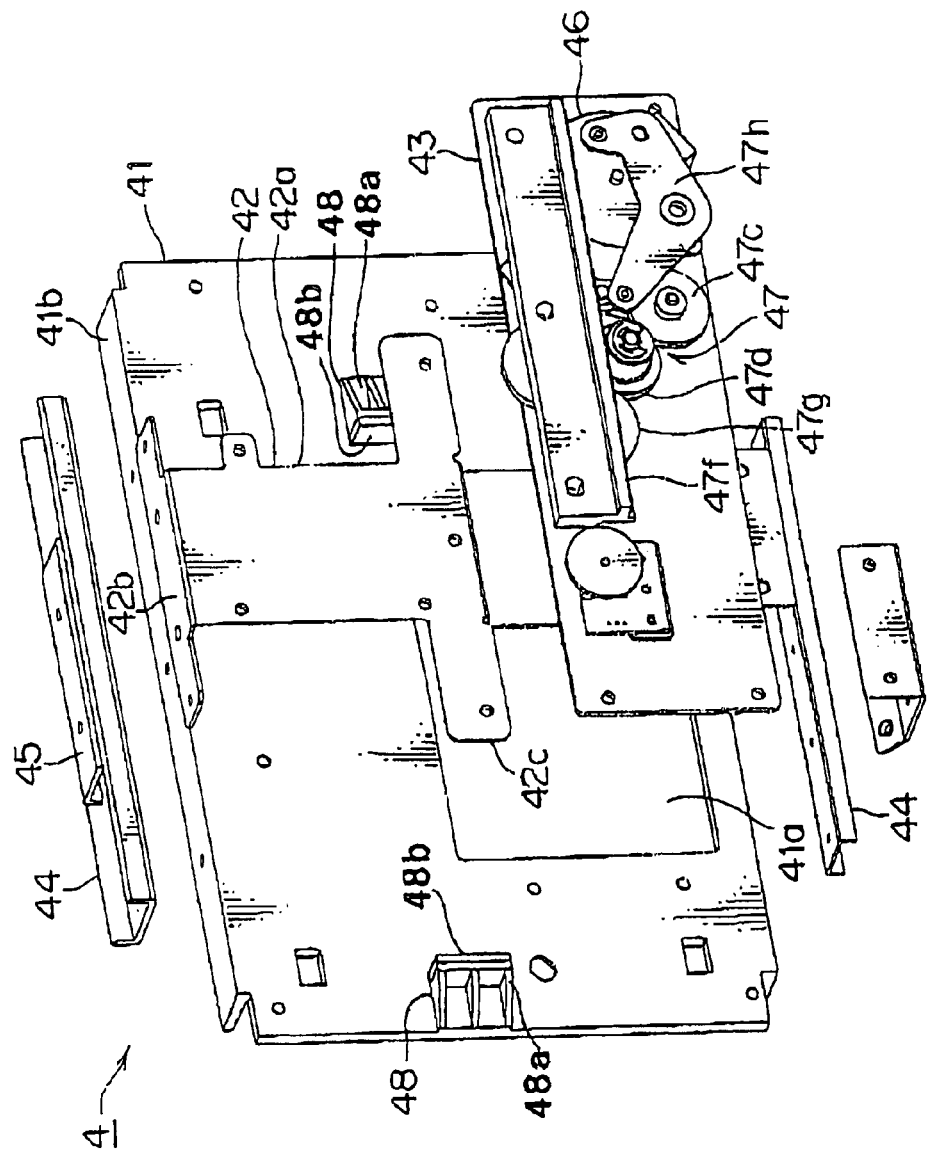
FIG. 5 is an exploded side view of the moving instrument of the vehicle display device of FIG. 1.
Figure 6:
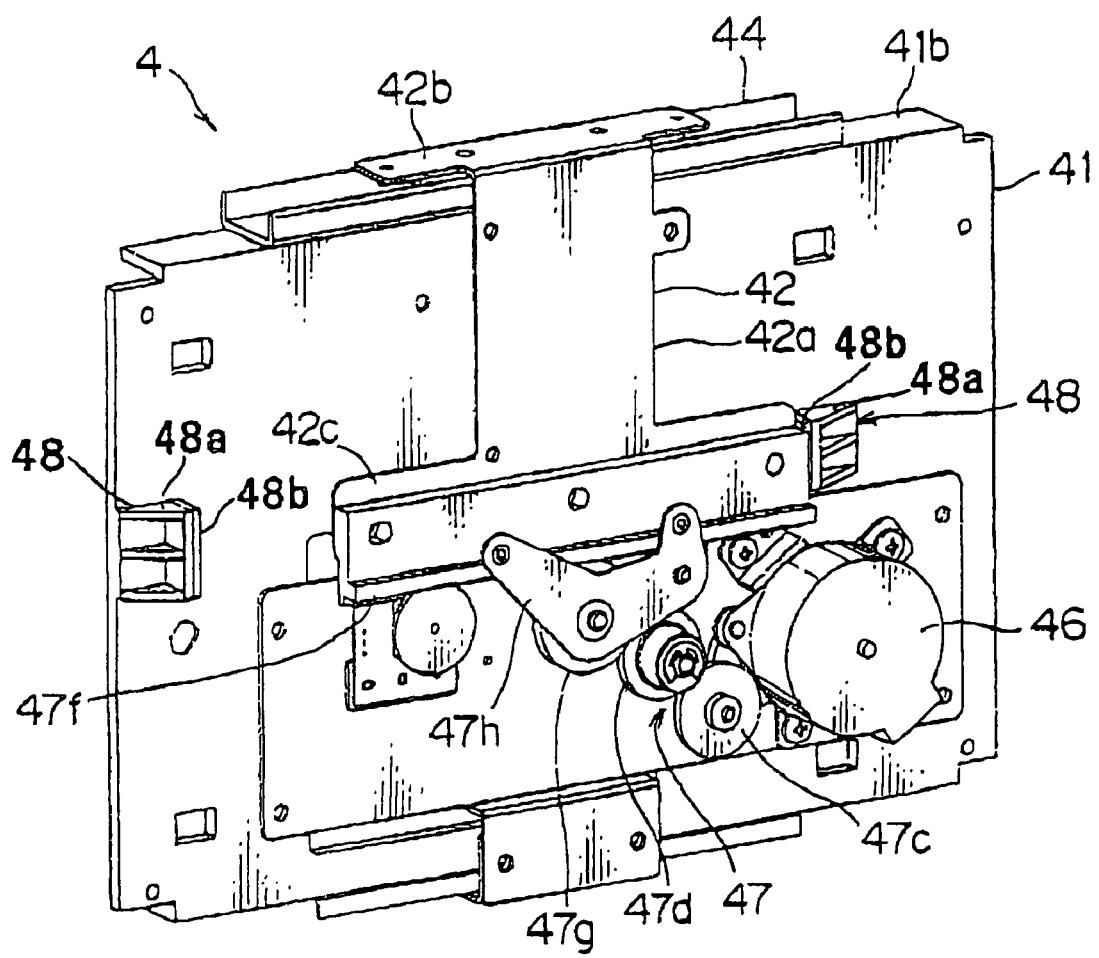
FIG. 6 is a side view of the moving instrument of the vehicle display device of FIG. 5.
Figure 8:
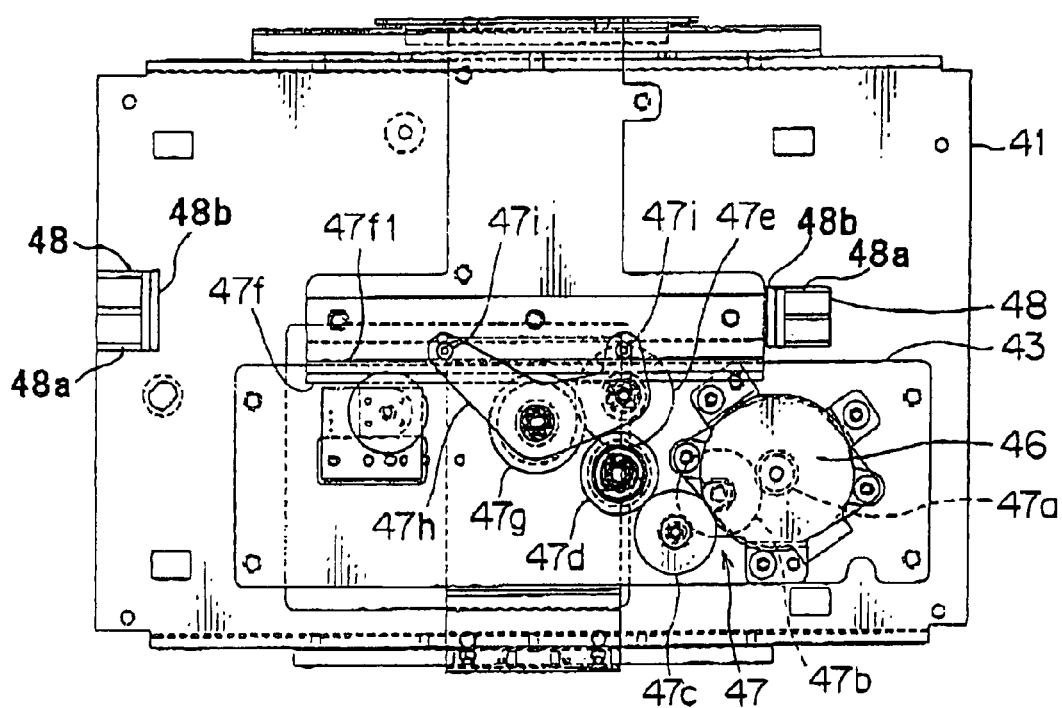
FIG. 8 is a perspective view of the moving instrument of the vehicle display device of FIG. 6.

Specifically, FIGS. 1 and 2 are exploded side views of both the front and the back of the vehicle display device in accordance with an exemplary embodiment of the invention; FIGS. 3 and 4 are side views of both the front and the back of the vehicle display device of FIG. 1; FIG. 5 is an exploded side view of a moving instrument of the vehicle display device of FIG. 1; FIG. 6 is a side view of the moving instrument in FIG. 5; FIGS. 7A to 7D correspond to a plan view, a front view, a left view and a right view of the moving instrument of FIG. 5, respectively; and FIG. 8 is a perspective view of the moving instrument of FIG. 5.

referring now to FIGS. 1 to 4, a vehicle display device 1 is an assembly of a circular dial member 2, a display such as a liquid crystal display (also designated as "LCD") 3, a moving instrument 4 connected to the circular dial member 2 and configured to move the circular dial member 2, an front case 7, and a rear case 5.

The circular dial member 2 is substantially positioned in front of the center of a display field 3a of the display 3, and is able to travel linearly across the display field by the driving of the moving instrument arranged on the back side of the display 3.

The circular dial member 2 is formed of opaque plastic material. In the circular dial member 2, a lens 6 is interfitted with a circular opening 2a formed therein. While the lens 6 may be a concave lens or a convex lens, a convex lens is employed in accordance with this embodiment of the present invention.

In FIGS. 1 and 2, the display 3 is shown to include a display body 3b holding a display field 3a, and a pair of radiators 3c. The display body 3b is formed in a flat rectangular plate. Within the display field 3a of the display body 3b, vehicle information can be displayed. For example, there are provided illuminated gauges or dials, which have an arcuate or semicircular scale thereon and are configured to display vehicle information, and pointer images, which move to indicate the appropriate vehicle information, at the center of the display field 3a. As an example of such an illuminated gauge, there is provided a tachometer indicating engine speed, which is calibrated so that its pointer rotates to the required position on the gauge or dial to indicate the measured value of the relevant engine speed. The dial and the pointer will constitute a meter for vehicle in an analogue form. Any other meters for indicating vehicle information and the relevant information can be also displayed on the display field 3a excluding the area required for the afore-mentioned tachometer.

The radiators 3c each are formed of metal such as aluminum, and are respectively connected to the outer edges of the display body 3b, as shown in FIG. 1. The radiator 3c is shown to include a radiator body 3d and a plurality of radiation fins 3e. The radiator body 3d is shaped as a plate. Heat released from a heating source positioned inside the display body 3b is transmitted into the radiator body 3d. A plurality of the radiation fins 3e extend outwardly from the radiator body 3d being perpendicular to the radiator body 3d. A plurality of the radiation fins 3e are arranged in parallel with each other and are configured to radiate heat transmitted from the display 3 and so on.

The vehicle display device 1 is synchronized with the movement of the circular dial member 2 in order that it moves the tachometer image from the center of the display field 3a, thereby ensuring that the tachometer image is surrounded by the circular dial member 2.

Referring next to FIGS. 5 to 8, the moving instrument 2 being configured to drive and move the circular dial member 2 will be illustrated in detail. The moving instrument 4 is disposed behind the display 3, and includes a base member 41 which can be also used herein interchangeably with a term "a support member", a movable member 42 which is coupled to the base member 41 in a movable manner and extends vertically behind the display 3, and a mounting plate for engaging a power source 43 which can be also used herein interchangeably with a term "a damper". There are provided a substantially rectangular opening 41a configured to fix the mounting plate for engaging the power source 43 thereto, and rail-receiving parts 41b, one of which is folded up and the other is folded down. Each rail-receiving part is engaged with the corresponding rail 44 respectively. The mounting plate for engaging the power source 43 is fixed to the base member 41 by a fixing member such as a fastener in order to cover the opening 41a.

The movable member 42 is shown to include a vertically extending base part 42a, a pair of vertically extending fitting pieces 42b, and a horizontally extending rack fitting part 42c in the proximity of the center of the base part 42a. Each of the fitting pieces 42b is coupled to both fitting parts 2b each formed on top and bottom of the circular dial member 2 and a rail member 45, which is interfitted with the rail 44 of the base member 41 in a slidable manner.

Figure 11A:
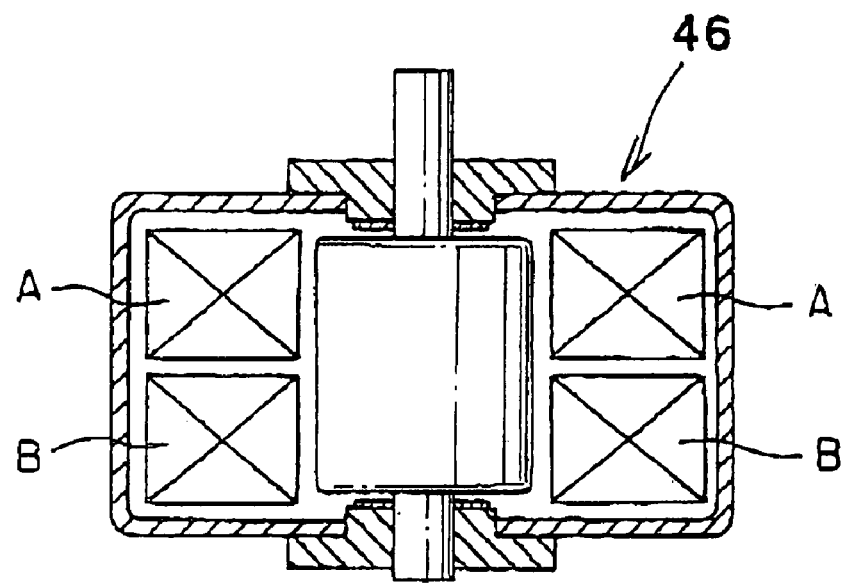
FIG. 11A is a cross-sectional view of a motor as a power source of the vehicle display device of FIG. 6.
Figure 11B:
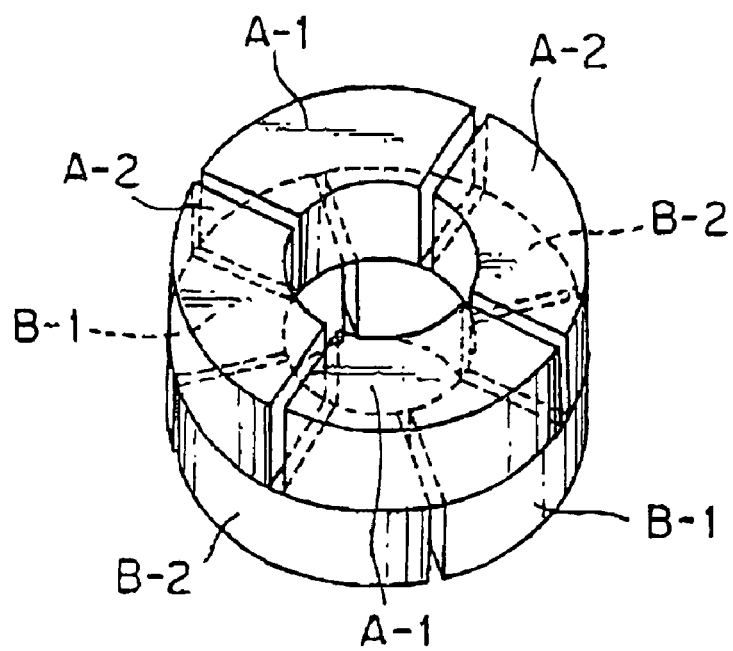
FIG. 11B is a side view of a part of a motor as a power source of the vehicle display device of FIG. 6.

The mounting plate for engaging the power source 43 is shown to include a motor 46, which is also designated herein as "a power source for movement", and a part of transmission device 47 for transmitting the driving force of the motor 46 into the movable member 42. As the motor 46, a permanent magnet type stepper motor (i.e. PM type stepper motor) is employed. As shown in FIGS. 11A and 11B, this PM type stepper motor has a construct of double steppers including a first stepper A and a second stepper B with respect to a rotor employing a permanent electromagnets. The first stepper A is divided into four steppers, i.e. A-1, A-2, A-3 and A-4, and the second stepper is also divided into four steppers, i.e. B-1, B-2, B-3 and B-4.

The excited waveforms transmitted to each of the steppers are shown in FIG. 12. In this stepper motor, the stepper A-1 is excited, then the stepper B-1, then the stepper A-2, then the stepper B-2, then the stepper A-3, then the stepper B-3, then the stepper A-4, then the stepper B-4, and then the stepper A-1 again in a manner that the upper stepper A and the lower stepper B are alternately excited with each other in a repeating pattern, and therefore the rotor can continue vertical movement.

The motor 46 generally produces vibration in all directions (of 3-dimension) during the rotation. In one example of the present invention, since the afore-mentioned PM type stepper motor is employed as the motor 46, it produces a large amount of vibration along the rotational axis thereof during the rotation. Due to this phenomenon, it is necessary that the vibration be prevented from being transmitted to the circular dial member 2 and be also controlled so as to reduce the noise generated therefrom.

Figure 9A:
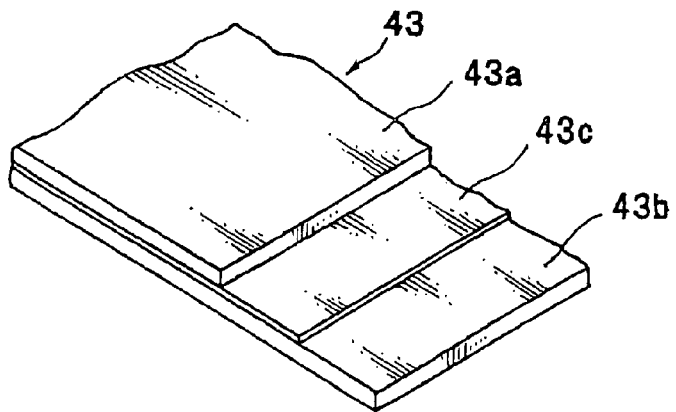
FIG. 9A is an exploded side view of the construction of a mounting plate for engaging a power source of the moving instrument of the vehicle display device of FIG. 6.
Figure 9B:
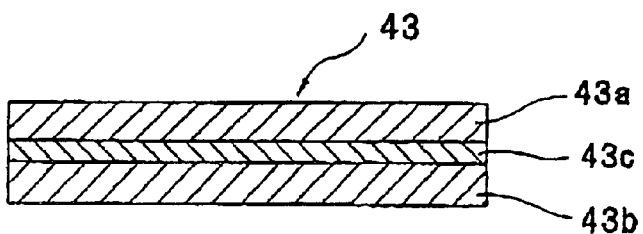
FIG. 9B is a cross-sectional view of the construction of a mounting plate for engaging a power source of the moving instrument of the vehicle display device of FIG. 6.
Figure 10:
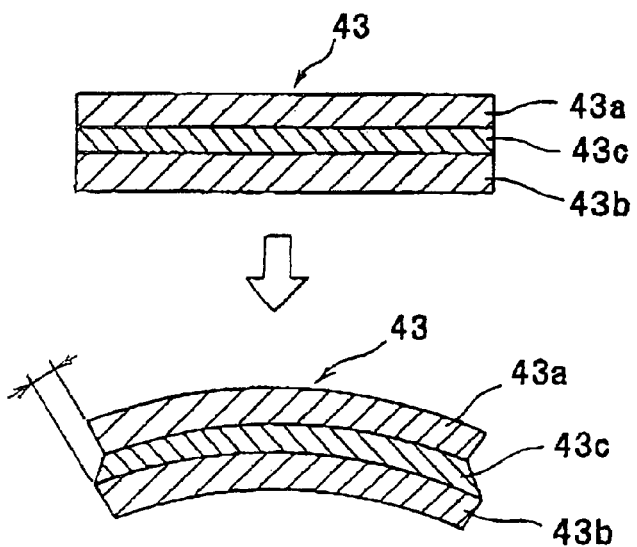
FIG. 10 is a view illustrating the function of the vibration damping steel sheet of FIG. 9.

To meet the above mentioned requirements, as shown in FIG. 9, the mounting plate for engaging the power source 43 is substantially formed of vibration damping steel sheet. In this vibration damping steel sheet (i.e., the mounting plate for engaging the power source 43), a viscoelastic resin plate 43c having a thickness of approximately 40 μm to 60 μm is sandwiched between two vibration damping steel sheets 43a and 43b, allowing for the absorption of the vibration generated by the motor 46 and so on. In other words, this vibration damping steel sheet, which can also indicate "the mounting plate for engaging the power source 43", can serve as a damper due to the shear deformation of the viscoelastic resin plate accompanied with bending vibration.

The damping coefficient generally belongs to the nature of material, and indicates how much amount of vibration is absorbed by the material in question. The higher the damping coefficient value, the more amount of vibration is absorbed by the material. The conventional steel plate, for example, cold stretch steel plate has a damping coefficient of 0.0005, which means that the vibration lasts for a long period of time once being generated. The vibration damping steel sheet has a damping coefficient of 0.35, which means that the plate has resin-like properties that can keep vibration thus produced from being transmitted. Accordingly, this vibration damping steel sheet can be used in the event that higher intensity as well as the afore-mentioned resin-like properties are needed.

A transmission device 47 is a gear-type transmission device, and as shown in FIG. 8, is shown to include a motor gear 47a fixed to the rotational axis of the motor 46, which is mounted to the mounting plate for engaging the power source 43, a first gear 47b meshing with the motor gear 47a, a second gear 47c meshing with the first gear 47b, the slip gear 47d meshing with the second gear 47c, and a output gear 47e meshing with the slip gear 47d. As a motor gear 47a to which the driving force is initially transmitted, and the first gear 47b, a helical gear can be used. As the second gear 47c, the slip gear 47d and the output gear 47e, a spur gear can be used. In other words, the motor gear 47a is the helical gear, and the transmission device 47 is equipped with the corresponding helical gear. While the helical gear is typically formed of polyacetal (i.e. POM), in accordance with this example of the present invention, a nylon-based helical gear is used.

Furthermore, the transmission device 47 is fixed to a rack fitting part 42c of the moving instrument 42, and also comprises the rack 47f configured to convert the turning movement of the output gear 47e into the horizontal linear movement thereof while meshing with the output gear 47e. The term "rack" can be used herein interchangeably with a term "interlocking member". An assembly of the rack 47f and the output gear 47e corresponds to an assembly of a rack and a pinion. The teeth of the rack 47f are formed at the bottom thereof. Because the rack 47f is fixed to the rack fitting part 42c, in cases where the driving force of the motor 46 is applied to the rack 47f, it can travel together with the moving instrument 42.

Besides, the transmission device 47 is equipped with a torque limiter 47g, which is in meshing engagement with the rack 47f in such a manner that the afore-mentioned output gear 47e is in meshing engagement with the rack 47f, and a pitch plate 47h. This pitch plate 47e can support the rotational axis of the torque limiter 47g and the output gear 47e, and contains a roller 47i at each end thereof. This roller 47i is rotatably hooked to the stepped portion 47f1 of the rack 47f, thereby ensuring that the output gear 47e is in tight meshing engagement with the rack 47f. The torque limiter 47g corresponds to a damper gear having a static frictional force of torque (for example, 2G) less than the rotational torque of the motor 46, and is configured to keep the circular dial member 2 from rattling in a dynamic state as well as a static state.

At the desired position in a longitudinal direction of the base member 41, there are provided a pair of stoppers 48 for controlling the moving stroke during the movement of the rack 47f. Each of the two stoppers 48 is in contact with each end of the rack 47f, respectively. One of the stoppers 48 (i.e. the left one in Drawings) is formed at a position where the moving instrument 42 originally exists before moving (i.e. the initial position of the circular dial member 2), the other stopper 48 (i.e. the right one in Drawings) is formed at a position where the moving instrument 42 finally arrives after moving (i.e. the maximum moving distance of the circular dial member 2).

Since the rack 47f is positioned between the two stoppers 48 such that it comes in contact with the two stoppers 48. By this construction, the moving range of the moving instrument 42 (i.e. the circular dial member 2) can be controlled. As shown in FIG. 14, a pair of the stoppers 48 each includes a main body 48a corresponding to a protuberance from the base member 41 and formed integrally with the base member 41, and a buffer 48b placed on each of two opposing surfaces of the two main bodies 48a.

The main body 48a is substantially formed of such hard synthetic resin as the base member 41. As mentioned above, this material does not deform or hardly deforms. The buffer 48b is substantially formed of thermosetting elastomer having elasticity. The buffer 48b is integrally formed with the main body 48a (i.e., the base member 41), for example, by means of two color-molding. The rack 48b can come in contact with the buffer 48b, in other words, the rack 47f is accessible to the buffer 48b, thus allowing the stopper to regulate or control the moving range of the rack 47f (i.e. the moving range of the circular dial member 2).

In FIGS. 1 and 2, the front case 7 is shown to include a design panel 10, an end leave member 11 and an exterior glass 12. The design panel 10 is substantially formed of transparent synthetic resin in a shape of planner sheet, and has a circular array of engine speed indicia printed on the exterior surface thereof. The design panel 10 is arranged between the display 3 and the circular dial member 2, and more specifically, is located in front of the display 3 and thereafter is coupled thereto, thus allowing lights from the display 3 illuminated.

The end leave member 11 is substantially formed of synthetic resin, and is provided in a frame shape. Moreover, the end leave member 11 is placed in front of the design panel 10, and thereafter is coupled to the periphery of the design panel 10. The exterior glass 12 is positioned in front of the end leave member 11, and thereafter is coupled to the end leave member 11 at its periphery.

The rear case 5 is substantially formed of synthetic resin, and is positioned behind the display 3 and the moving instrument 4. In FIG. 2, the rear case 5 is shown to include a sheet of back wall 13, and a plurality of peripheral walls 14 each standing from a peripheral edge of the back wall 13. The peripheral walls 14 are constituted by a left side wall, a right side wall, a top wall and a bottom wall. The back wall 13 is arranged in parallel with the display field 3a of the display 3. In each of the right side wall and the left side wall, there exists a notch 15 which is defined by cutting off an edge, which is not in contact with the back wall 13. The notch 15 is configured to pass the radiator body 3b of the radiator 3c of the display 3 therethrough in cases where the rear case 5 is coupled to the design panel 10.

Figure 15:
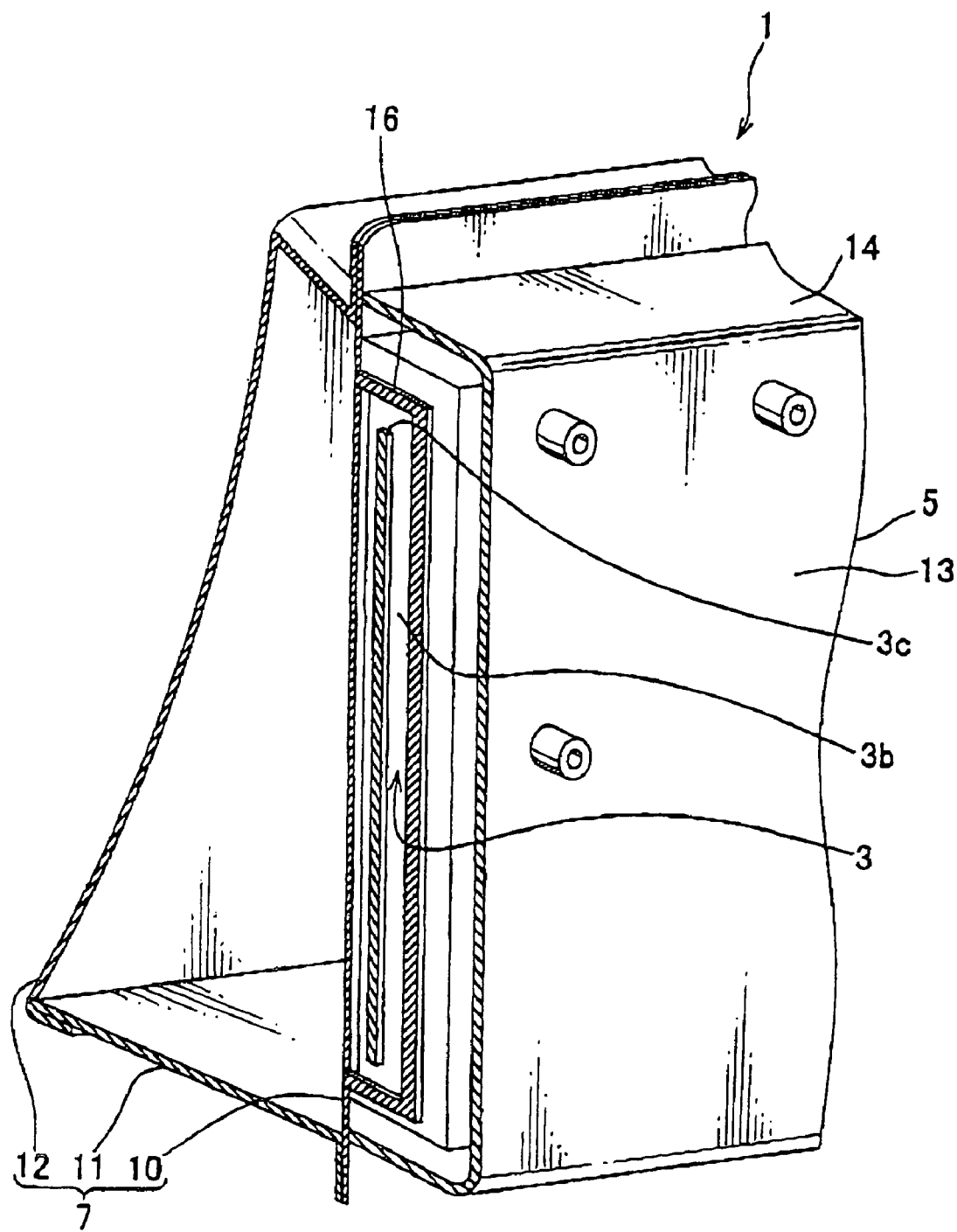
FIG. 15 is a cross-sectional view taken along the line XV-XV in FIG. 4.

In addition, as shown in FIG. 15, a packing 16 is provided as a sealing member, along the remaining notched peripheral edge of the right side wall and the left side wall. The packing 16 is substantially formed of synthetic resin with elasticity (for example, rubber) and is formed along the peripheral edge of the remaining uncut-off portion. When the rear case 5 is coupled to the design panel 10 by passing the radiator body 3d of the radiator 3c of the display 3 through the notch 15, the packing 16 comes closely in contact with the display body 3b and then seal the clearance between the display body 3b and the notch 15.

Both the display body 3b of the display 3 and the moving instrument 4 are positioned between the front case 7 and the rear case 5, and thus these four component, i.e., the display body 3b, the moving instrument 4, the front case 7 and the rear case 5 are in contact with one another. Since the design panel 10 is in contact with the display body 3b of the display 3, and the packing 16 attached to the front case 5 is in contact with the display body 3b of the display 3, thus allowing for tight closure of the clearance between the design panel 10 and the rear case 5 (i.e. the display body 3b of the display 3). By this construction, the front case 7 and the rear case 5 can prevent dust from adhering to the display body 3b. Moreover, the display body 3b of the display 3 is completely closed with the front case 7 and the rear case 5, and therefore dust can be prevented from adhering to the display body 3b of the display 3.

During afore-mentioned construct, when the motor 46 starts to rotate in dependence on driving instruction signal, the rotational movement of the output gear is converted into linear movement by means of the rack 47f and then the linear movement is transmitted into the movable member 42, which is guided by the vertically slidable movement on the rail from the initial position where one end of the rack 47f abuts against the buffer 48b of one stopper 48, in order to travel linearly in a horizontal direction. Accordingly, the fitting piece 42b and the circular dial member 2 connected thereto travel linearly in a direction where the motor 46 is rotated across the display field 3a of the display 3. The moving stroke of the movable member 42 corresponds to a distance to a final position where the other end of the rack 47f abuts against the buffer 48b of the other stopper 48, and therefore, the movement of the circular dial member 2 on the display field 3a of the display 3 is limited. When the other end of the rack 47 abuts against the buffer 48b of the other stopper 48, the motor 46 makes a stop and, accordingly, the movable member 42, i.e. the circular dial member 2 is stopped.

When the motor 46 is commanded to rotate in a counter direction, thereby to cause the motor 46 to rotate in the counter direction, the rotational movement of the output gear 47e is converted into the linear movement by means of the rack 47f, and the linear movement thus converted is transmitted into the movable member 42, which rotates in the counter direction from the final position where the other end of the rack 47f abuts against the buffer 48b of the other stopper 48. As a result, the movable member 42, i.e. the circular dial member 2 will be shifted back to its initial position. At this time, the motor 46 will stop, and accordingly, the movable member 2 will finally stop.

Moreover, there is provided a microcomputer (not shown) to control both the display of the display 3 and the motor 46 drive, which causes the circular dial member 2 to move in dependence on the display of the display 3. By controlling the microcomputer, the circular dial member 2 can be arranged such that it surrounds the tachometer image displaying the engine speed on the display field 3a of the display 3.

Even though the movement of the movable member 42 is interrupted by an error as occurred during the operation of the moving instrument 4, the positions of the circular dial member 2, the design panel 10, and the pointer image are maintained in their right position without departing therefrom. Accordingly, the image of tachometer indicating the engine speed is surrounded by the circular dial member 2, thereby allowing the tachometer image to be visualized independently of other portion or image.

As described above, in the vehicle display device with the circular dial member 2, in cases where the circular dial member 2 travels across the display field 3a of the display 3, unacceptable noise can occur due to the vibration of the power source for movement (i.e., the motor 46). Moreover, in cases where this vibration is transmitted into the movable member 2, there occurs the rattling of the circular dial member 2, which in turn interrupts the optimized visualization thereof to provide a vehicle operator with a poor image. In other words, even in the afore-mentioned example of the vehicle display device of the present invention, the vibration generated by the motor 46 can be transmitted into the circular dial member 2 via two pathways. One is mediated by the transmission device 47, then the rack 47f, and then the movable member 42, and the other is mediated by the mounting plate for engaging the power source 43 and then the base member 41.

In this regard, since the mounting plate for engaging the power source 43 equipped with the motor 46 in accordance with one example of the present invention includes the vibration damping steel plate, the vibration resulting from the motor 46 is dampened by this vibration damping steel plate, thereby causing the noise to decrease. In addition, the vibration is never transmitted into the circular dial member 2 via any one of the afore-mentioned two pathways, and therefore the circular dial member 2 is kept from rattling.

Further, in accordance with another example of the present invention, the base member 41, to which both the motor 46 and the transmission device 47 are directly attached, may be comprised of a single element, i.e., the vibration damping steel plate. However, in this case, there is needed a lot of the vibration damping steel plate, which also increases the manufacture cost. In this example, since only the mounting plate for engaging the power source 43 equipped with the motor 46 and the transmission device 47 is comprised of the vibration damping steel plate, and is coupled to the base member 41, there is needed the vibration damping steel plate having relatively small area, thereby reducing the manufacture cost.

Further, since the helical gear substantially formed of nylon is used as an initial gear for the transmission of the driving force of the motor 46, the motor gear 47 and the first gear 47b has the reduced level of noise compared to conventional products. In other words, the helical gear has more teeth than the spur gear, and therefore the transmission torque is efficiently distributed, thus allowing the vibration to decrease. Consequently, the noise can be decreased. Further, because the helical gear is substantially formed of nylon, which is soft resin having a lower Young's modulus than POM, tooth bearing will produce a decreased noise during the rotation of the gear.

Figure 13A:
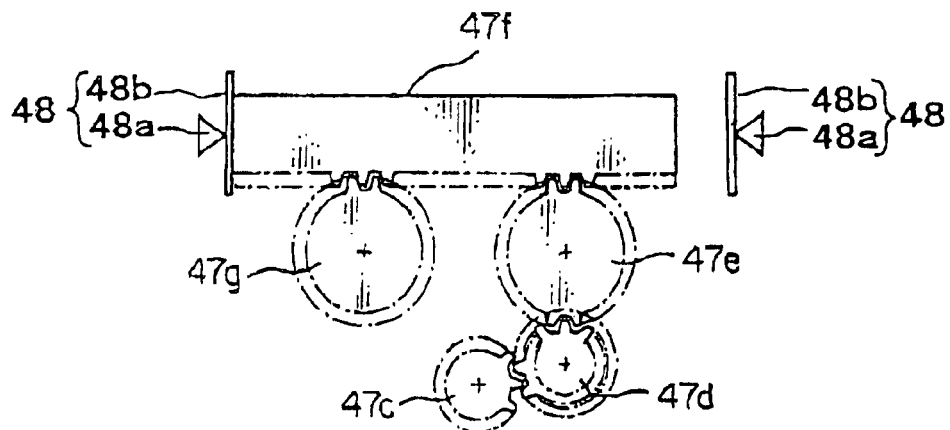
FIG. 13A is a view illustrating the function of a torque limiter in the moving instrument of the vehicle display device of FIG. 6.

As the rack 47f is in meshing engagement with the torque limiter 47g, the circular dial member 2 can be prevented from rattling despite the existence of external vibration, etc. In other words, as shown in FIG. 13A, in cases where the motor 46 is in a static state (i.e., unexcited state) and the movable member 42, i.e. the circular dial member 2 is retained in its initial position, the output gear 47e is provided with no holding torque. Accordingly, in the output gear 47e, there are only detent torque and gear sliding load. Therefore, in cases where there is no torque limiter 47g, the output gear 47e will easily be rotated by even a small amount of external force applied thereto. However, in accordance with one example of the present invention, since the torque limiter 47g is in meshing engagement with the rack 47f, insomuch as the external force applied thereto does not exceed 2G, the rack 47f would not move more than back rash of the output gear 47e, and therefore the rattling of the circular dial member 2 resulting from the vibration produced externally would not occur.

Figure 13B:
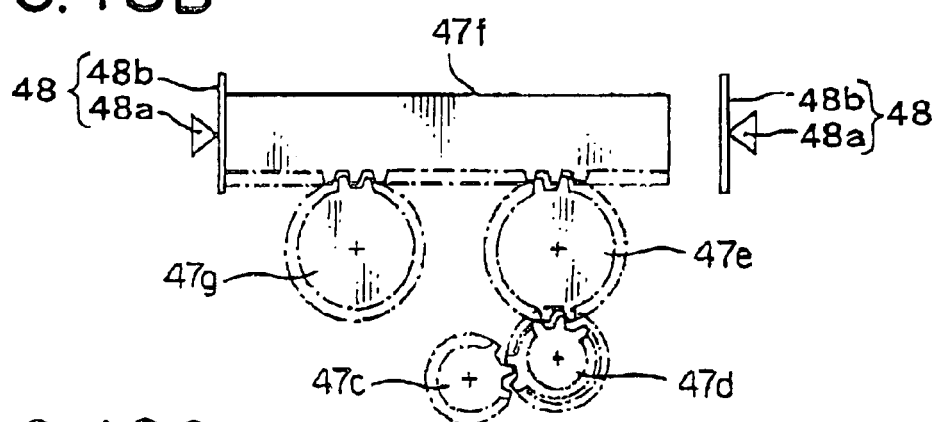
FIG. 13B is another view illustrating the function of a torque limiter in the moving instrument of the vehicle display device of FIG. 6.
Figure 13C:
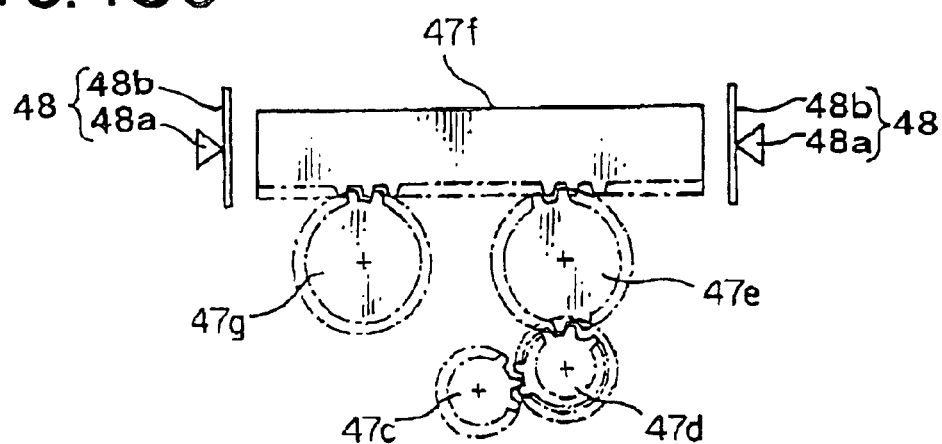
FIG. 13C is yet another view illustrating the function of a torque limiter in the moving instrument of the vehicle display device of FIG. 6.

On the other hand, as shown FIG. 13B, in cases where the movable member 42 (i.e. the circular dial member 2) returns back to its initial position from its final position by the rotation of the motor 46 (i.e. the motor in its excited state), the left side of the teeth of the output gear 47e is in contact with the right side of the teeth of the rack 47f, and the left side of the teeth of the rack 47f is in contact with the right side of the teeth of the torque limiter 47g. Accordingly, the rack 47f completely meshes with both the output gear 47e and the torque limiter 47g, it cannot proceed to either way any longer. Likewise, in cases where the movable member 42 arrives at the final position from its initial position, the rack 47f also completely meshes with both the output gear 47e and the torque limiter 47g, and thus it cannot proceed to either way any longer.

As a result, even during the movement of the movable member 42, i.e. the circular dial member 2, in other words, even if the motor 46 is excited, the rattling of the circular dial member 2 resulting from the vibration produced externally would not occur.

Further, since the display body 3b of the display 3 is covered with the front case 7 and the rear case 5, foreign matter is prevented from invasion inside the front case 7 and the rear case 5, and thus no foreign matter will be attached to the display field 3a of the display 3. Accordingly, information displayed on the display 3 can clearly be viewed by a vehicle operator. Since the radiator 3c is exposed through the notch 15 of the rear case 5, heat produced from the display 3 can be immediately radiated.

Since each of two stoppers 48 is provided with a buffer 48b for controlling the moving range of the movable member 42, the noise, which may occur when the rack 47f, which moves in dependence on the movable member 42, collides against the stopper 48, can be suppressed. Accordingly, the noise which occurs during the movement of the movable member 42 can be attenuated.

Since the main body 48a of the stopper 48 are substantially formed of the synthetic resin-based material, a possibility that the deformation of the main body 48a of the stopper 48 may occur when the rack 47f colliding against the stopper 48 can be remarkably reduced. As a result, the rack 47f and the movable member 42, i.e. the circular dial member 2 can be controlled to move within the desired range.

(The Second Embodiment of the Vehicle Display Device in Accordance with the Present Invention)

Figure 16:
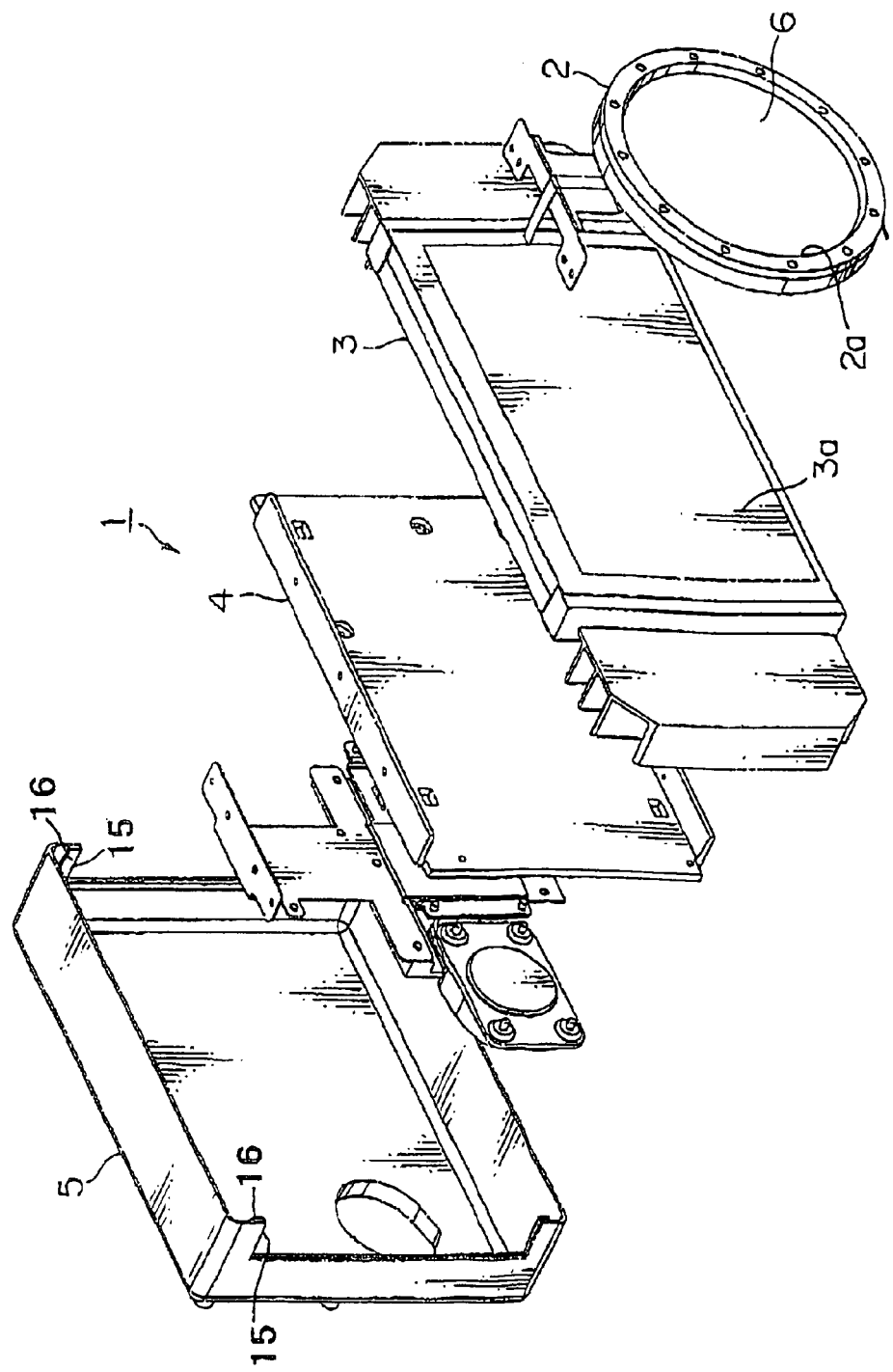
FIG. 16 is an exploded side view of the front of a vehicle display device in accordance with another exemplary embodiment of the invention.
Figure 17:
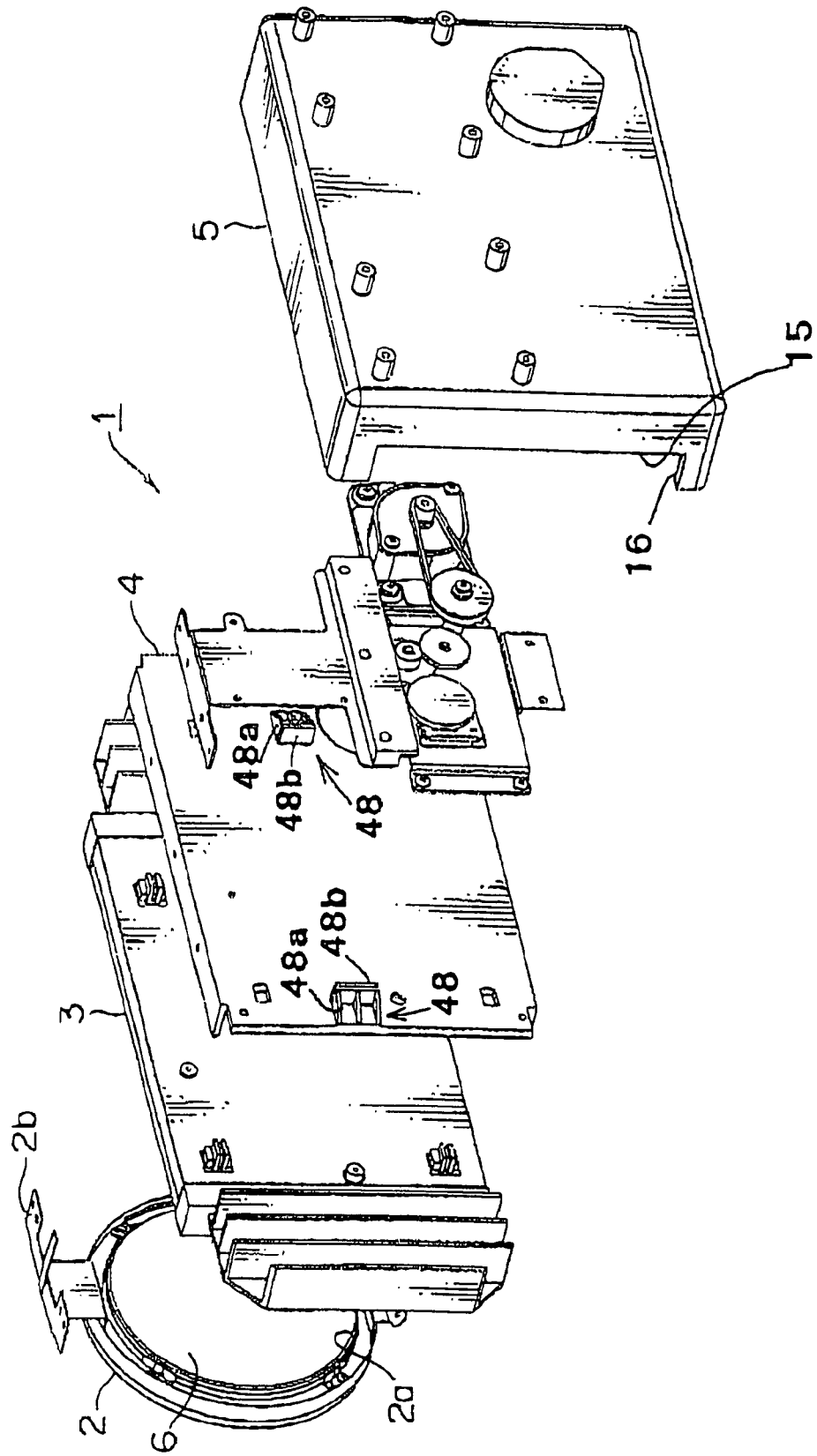
FIG. 17 is an exploded side view of the back of the vehicle display device of FIG. 16.
Figure 18:
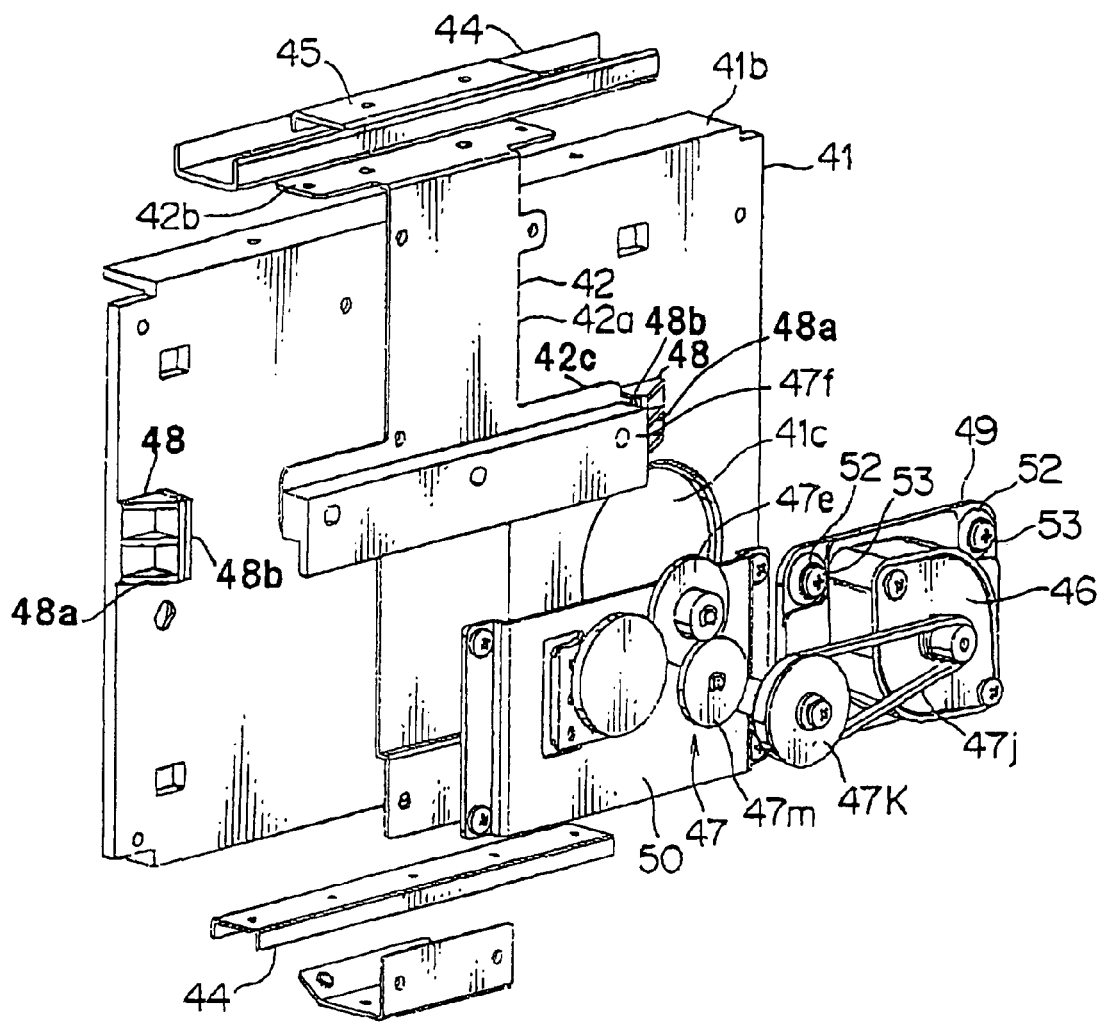
FIG. 18 is an exploded side view of the moving instrument of the vehicle display device of FIG. 16.
Figure 19:
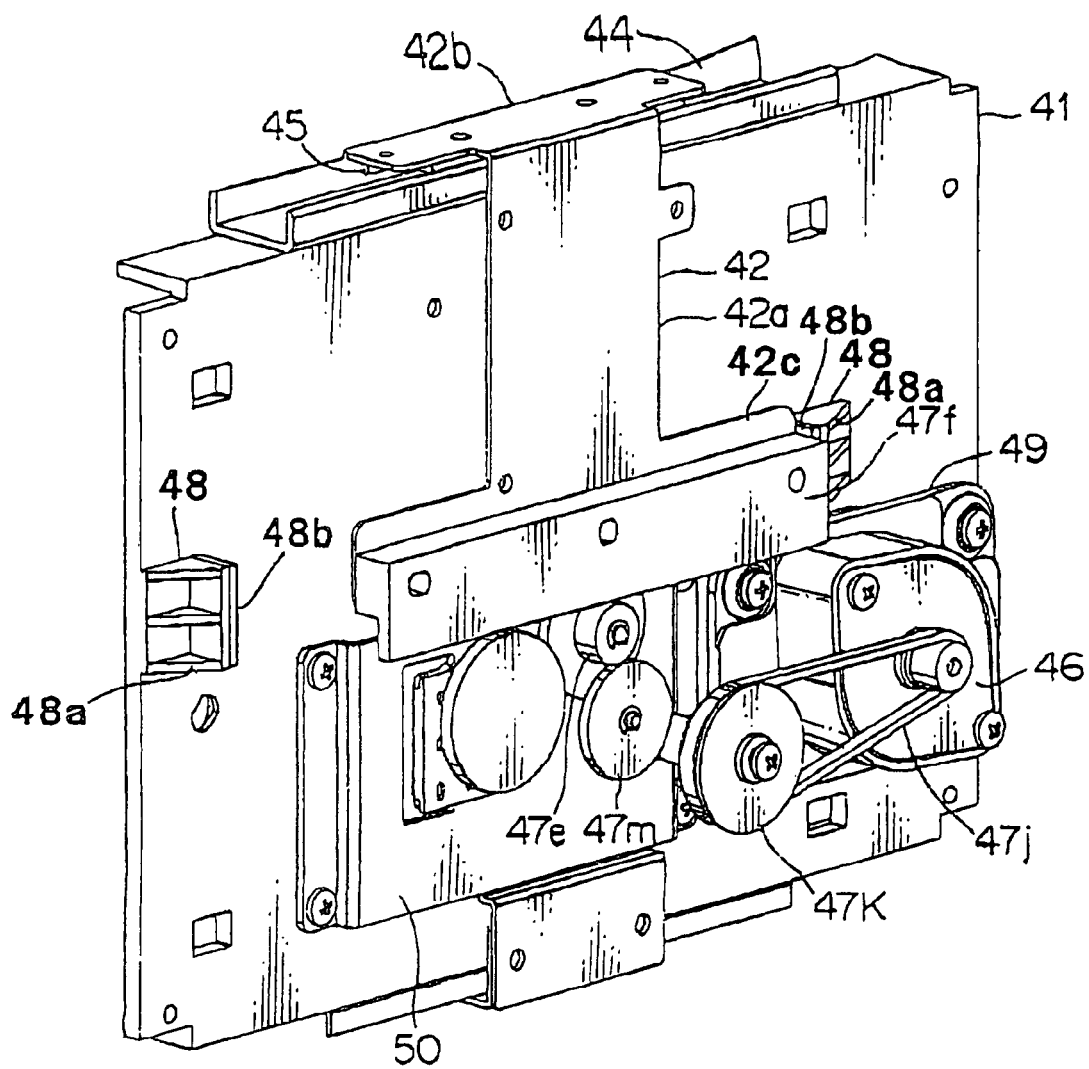
FIG. 19 is a side view of the moving instrument of the vehicle display device of FIG. 16.

FIG. 16 is an exploded side view of the front of the vehicle display device in accordance with another exemplary embodiment of the present invention; FIG. 17 is an exploded side view of the back of the vehicle display device of FIG. 16; FIG. 18 is an exploded side view of the moving instrument of the vehicle display device of FIG. 16; FIG. 19 is a side view of the moving instrument of the vehicle display device of FIG. 16; and FIGS. 20A to 20D correspond to a plan view, a front view, a left side view, and a right side view of the moving instrument of the vehicle display device of FIG. 16, respectively. Accordingly, like reference numerals are used for the common elements between the first example of the vehicle display device (i.e. FIGS. 1 to 7) and the second example of the vehicle display device (i.e. FIGS. 16 to 20) in accordance with the present invention. In this regard, the same elements as previously described in connection with the first embodiment of the vehicle display device of the present invention will be omitted from the following description with relation to the second embodiment of the vehicle display device of the present invention.

While the first embodiment of the vehicle display device in accordance with the present invention is provided with the gear-type moving instrument 4 transmitting all the driving force produced from the motor 46 through the gear, the second embodiment of the vehicle display device in accordance with the present invention is provided with the moving instrument 4 comprising a belt-type transmission device transmitting the driving force produced from the motor 46 through a belt.

The construction of the moving instrument 4 causing the circular dial member 2 to travel across the display field 3a of the display 3 will be discussed in detail below with reference to FIGS. 18 to 20. The moving instrument 4 is shown to include a base member 41, a movable member 42 which is coupled to the base member 41 in a movable manner and extends vertically behind the display 3 (i.e. on the rear side of the display 3), an mounting plate for engaging power source 49, and a mounting plate for engaging transmission device 50. At the lower part of the base member 41, there are provided a substantially round opening 41c configured to fix the mounting plate for engaging the power source 49 to the edge portion 41e of the base member 41, and rail-receiving parts 41b, one of which is folded up and the other is folded down. The mounting plate for engaging the power source 49 corresponds to a casing for the motor 46, and is fixed to the base member 41 by a fixing member such as a fastener in order to cover the opening 41c. Similarly, the plate for receiving the transmission device 50 is also fixed to the base member 41 by a fixing member such as a fastener.

The movable member 42 is shown to include a vertically extending base part 42a behind the display 3, and a rack fitting part 42c extending horizontally in the proximity of the center of the base part 42a. Two rail members 45 are respectively attached to both ends of the base part 42a in such a manner that it is slidably interfitted with the rail 44 on the base part 41.

A motor 46, a power source for movement is mounted to the mounting plate for engaging the power source 49. As the motor 46, a permanent magnet type stepper motor (i.e. PM type stepper motor) can be employed.

Figure 21:
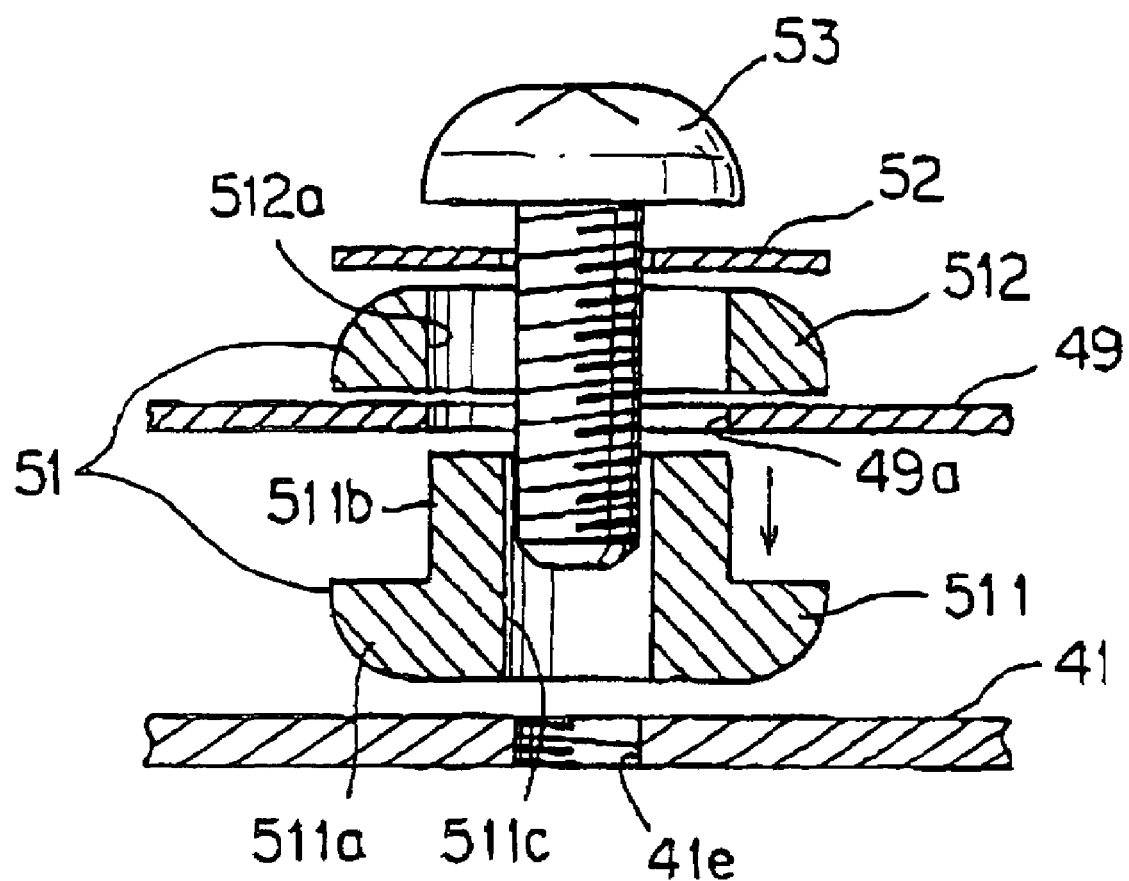
FIG. 21 is a cross-sectional view of the assembly of the mounting plate for the engaging the power source and a base member in the vehicle display device of FIG. 16.

While in the first embodiment of the vehicle display device in accordance with the present invention the mounting plate for engaging the power source 43 is substantially formed of the vibration damping steel plate, which is adapted to absorb the vibration generated by the motor 46, in the second embodiment of the vehicle display device in accordance with the present invention, as shown in FIG. 21, a buffer having damping properties, for example, a bushing 51 can be employed as a damper. For example, this bushing 51 is primarily made from soft gel material such as αGEL (registered trademark), and includes a plurality of portions designated as the numerals 511 and 512, respectively. The portion designated as the numeral 511 (hereinafter, the portion 511) is unitarily constructed, and shown to include a retaining flange 511a, a cylinder-shaped portion 511b and a threaded internal cavity 511c. The portion designated as the numeral 512 (hereinafter, the portion 512) has also an internal cavity 512a for receiving the cylinder-shaped portion 511b therein.

The motor casing which is designated as the mounting plate for engaging the power source 49 can be fixed to the base member 41 by a fastener 53, which passes the busing 51 through to reach the base member 41, in its four edges. In other words, the motor casing is provided with bores 49a in its four edges. In this construction, the cylinder-shaped portion 511b of the portion 511 is initially inserted through the bores 49a, thus rendering the flange portion 511a sandwiched between the base member 41 and the motor casing. Subsequently, the cylinder-shaped portion 511b is inserted into the internal cavity 512a of the portion 512, and then the assembly of the threaded fastener 53 and a washer 52 is inserted into the threaded internal cavity 511c and finally threadably engages into the counter-bore 41e for the fastener 53, which exists in the base member 41.

As shown in FIGS. 18 to 20, a transmission device 47 includes a belt 47j, which is rolled up a winch mounted on the rotational axis of the motor 46, a belt pulley 47k for transmitting a rotational force via the belt 47j, a first gear 47m meshing with a gear which is not shown but is placed under the belt pulley 47k, and an output gear 47e meshing with the first gear 47m. Further, the transmission device 47 also includes a rack 47f, which is fixed to a rack fitting part 42c of the movable member 42 and configured to convert the rotational movement of the output gear 47e into the horizontal linear movement while meshing with the output gear 47e. In rack 47f, the teeth are formed in the bottom thereof. Due to a constant tension applied to the belt 47j, splitting of the gear teeth can be effectively prevented.

In accordance with the second example of the vehicle display device, since the belt 47j is used at a position where the driving force of the motor 46 is initially transmitted, a vibration generated by the motor 46 is absorbed by the belt 47j, and therefore will not transmitted into the movable member 42 and the circular dial member 2 via the gear of the transmission device 47. Further, in the case of mounting the motor 46 to the base member 41, since the bushing 51, i.e. a buffer having damping properties is used, the vibration generated by the motor 46 is dampened by the bushing 51, and thus will not be transmitted into the base member 41, the movable member 42 and the circular dial member 2. By this construction, even though the motor 46 is driven, noise will be remarkably reduced in the vehicle display device 1 and the vibration generated by the motor 46 will not be transmitted into the circular dial member 2, thus making it possible to prevent the circular dial member 2 from rattling.

While several embodiments of the present invention have been described, it should be understood that the present invention is not so limited, and modification may be made within the scope of the invention.

For example, while in the foregoing embodiments of the present invention a display panel is utilized as a display device, organic electroluminescence display, plasma display and so on other than the display panel can be also utilized as the display device.

Moreover, while in the foregoing embodiments of the vehicle display device in accordance with the present invention, the circular dial member 2 has a round shape, the shape of the circular dial member 2 is not limited thereto. For example, the shape may be polygon such as tetragon, and may be also a circle a part of which constitutes a line. Any circular dial member 2 causing one to differentiate a display field having numbers or other indicia arranged in an arcuate or circular pattern and a background can be also preferably used in the present invention without being limited to the shape thereof.

Further, while in the first embodiment of the vehicle display device in accordance with the present invention, the motor 46 is coupled to a support member 41 via the mounting plate for engaging the power source 43 which is substantially formed of the vibration damping steel plate, it may be also possible that the motor 46 is coupled to the rear case through the vibration damping steel plate.

Figure 22:
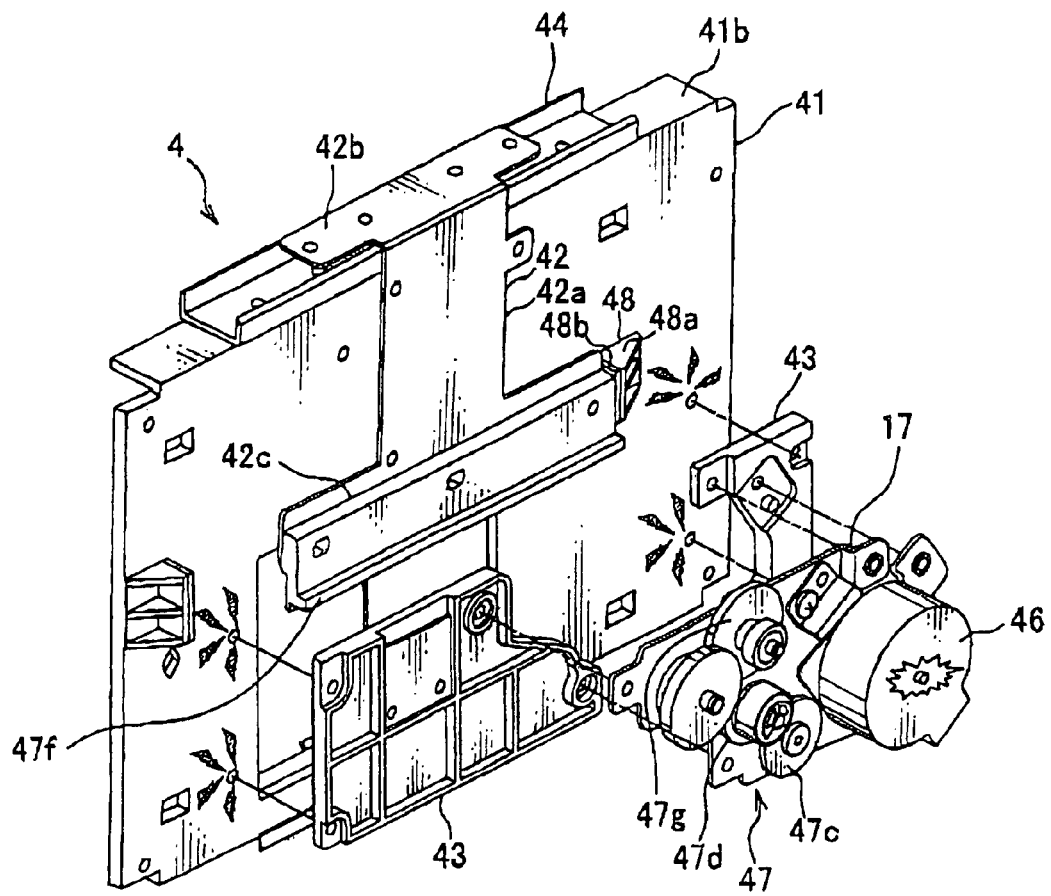
FIG. 22 is a partly exploded side view of a modification of the moving instrument of the vehicle display device of FIG. 6.
Figure 23:
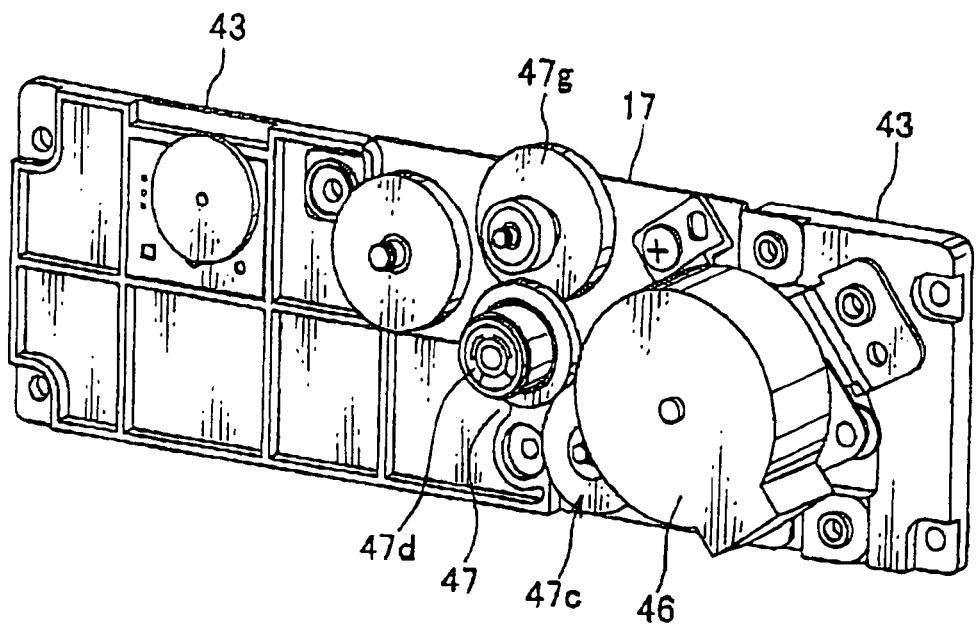
FIG. 23 is a side view of the assembly of a motor and a mounting plate for engaging the power source in the vehicle display device of FIG. 16.
Figure 24:
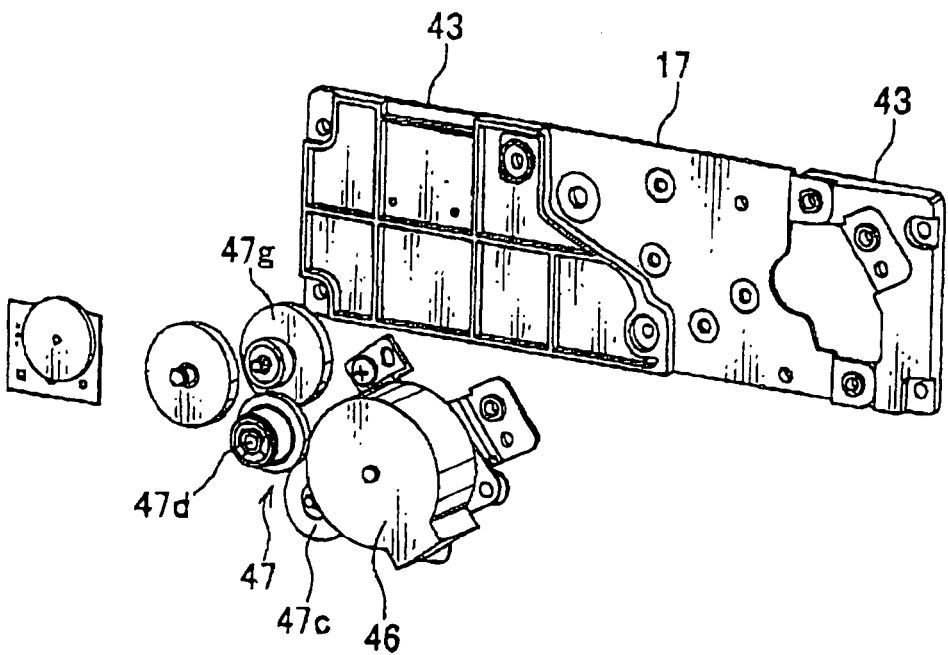
FIG. 24 is an exploded side view of the assembly of the motor and the mounting plate for engaging the power source of FIG. 23.

In addition, in the first embodiment of the vehicle display device in accordance with the present invention, the mounting plate for engaging the power source 43, which is used as the damper, can be constituted by a piece of vibration damping steel plate. However, as shown in FIGS. 22 to 24, in another embodiment of the vehicle display device in accordance with the present invention, the mounting plate for engaging the power source 43 used as the damper may be primarily constituted by resinous material, which is sandwiched between a driving base 17 being substantially formed of sheet metal and the base member 41. With reference to FIGS. 22 to 24, the same elements as previously described in connection with the embodiments of the vehicle display device of the present invention are also designated as the same numerals, and the detailed descriptions thereof are omitted herein.

Referring now to FIGS. 22 to 24, the motor 46 and the transmission device 47 are respectively mounted on the driving base 17, which is spaced apart from and parallel to the base member 41. The mounting plate for engaging the power source 43 formed of resin-based material is divided into two parts, and mounted to the base member 41 along the width of the vehicle display device 1, being spaced apart therefrom. The mounting plate for engaging the power source 43 is preferably formed of cost-effective hard synthetic resin-based material, which either does not deform or hardly deforms. The driving base 17 is mounted on the surface of the mounting plate for engaging the power source 43. In other words, the mounting plate for engaging the power source 43 (i.e. the resin plate) is sandwiched between the driving base 17 and the base member 41.

Since the mounting plate for engaging the power source 43 as a damper is sandwiched between the driving base 17 and the base member 41 and also is substantially formed of cost-effective synthetic resin, not only the noise and vibration can be attenuated, but also the mounting plate for engaging the power source 43, i.e. the damper can be manufactured at relatively low cost. Since the mounting plate for engaging the power source 43 is substantially formed of the resin-based plate and the driving base 17 is substantially formed of sheet metal, the dimension, i.e. size of the motor 46 as the power source for movement as well as that of the transmission device 47 can be precisely controlled. The vibration generated by both the motor 46, i.e. the power source for movement and the transmission device 47 can be dampened inside the mounting plate for engaging the power source 43 formed of resin-based material. Moreover, the present invention has enhanced recycling properties in comparison with the conventional products in that the motor 46 and the transmission device 47 are respectively supported by two different parts, i.e. the mounting plate for engaging the power source 43 being substantially formed of resin-based material and the driving base 17 being substantially formed of sheet metal.

In accordance with the embodiment of the present invention as described, the stopper 48 is provided which is of integral, one-piece construction of the main body 48a and the buffer 48b by way of two-color molding. Meanwhile, as shown in FIGS. 25A and 25B, the main body 48a and the buffer 48b may be independently formed. In this case, for the purpose of engaging the buffer 48b with the main body 48a, there may be provided an engaging part.

The present invention can provide its characteristic effects as follows.

According to a preferred example of the present invention, since the power source is coupled to the support member through the damper the vibration generated by the power source is dampened by the damper, thus reducing the level of noise. Further, the vibration will not be transmitted into the circular dial member, thereby keeping the circular dial member from rattling.

According to another example of the present invention, since the vehicle display device can further include a transmission device coupled to the support member through the damper, and configured to transmit driving force generated by the power source into the movable member, the vibration generated by the transmission device will not be directly transmitted into the circular dial member, thereby keeping the circular dial member from rattling.

According to the yet another example of the present invention, since the transmission device can be a gear-type one, and can include a helical gear which the driving force is initially transmitted from the power source to and, has teeth more than a spur gear, the transmission torque will be distributed, and therefore the production of the vibrations and noise will be also reduced.

According to the still yet another example of the present invention, since the transmission device can comprise a rack and pinion set configured to convert turning of the power source into linear travel, and in turn to transmit the linear travel to the movable member, the rack meshing with a torque limiter having static frictional force of lower torque than turning torque of the power source, even though the movable member is traveling, the circular dial member can be kept from rattling.

According to the still yet another example of the present invention, since the damper can include a vibration damping steel plate, the circular dial member can be kept from rattling and therefore noise can be also reduced.

According to the still yet another example of the present invention, since the damper can be made of synthetic resin-based material, and is sandwiched between a driving base on which the power source is mounted and the support member, noise can be reduced and the circular dial member can be kept from rattling, thereby allowing the circular dial member to be produced at a reasonable cost.

According to the still yet another example of the present invention, since foreign matter can be prevented from attaching to the display field of the display, information displayed on the display field can be clearly viewed by a vehicle operator. Moreover, since the radiator is exposed through the notch portion of the rear case, heat resulting from the display can be immediately radiated.

According to the still yet another example of the present invention, since the interlocking member can suppress noise produced even in cases where the interlocking member collides against the stopper, noise associated with the traveling of the movable member can be reduced.

According to still yet another example of the present invention, since the stopper body can be prevented from deformation when the collision between the stopper and the interlocking member occurs, the interlocking member and the movable member (i.e. the circular dial member) can be securely controlled to travel within a predetermined range. According to still yet another example of the present invention, since there is provided a vehicle display device comprising a circular dial member positioned in front of a display field of a display, at least partly surrounding the display field, and traveling linearly across the display field in cases where a movable member movably supported by a support member and connected to the circular dial member is driven by a power source, and a transmission device coupled to the support member, transmitting the driving force generated by the power source into the movable member, and comprising a belt to which the driving force is initially transmitted, the power source being coupled to the support member through a buffer-containing damper, the buffer being sandwiched between the power source and the support member in cases where the power source is fixed to the support member, the vibration is absorbed by the buffer, and does not be transmitted into the support member, the movable member, and the circular dial member. Therefore, in the vehicle display device, the level of noise can be reduced when the power source is driven. Further, the vibration will not be transmitted into the circular dial member, thereby keeping the circular dial member from rattling. Due to the use of the belt, there is no need to precise gap adjustment between the teeth as needed in cases where the transmission device is merely constituted by gears.

What is claimed is:

1. A vehicle display device comprising a circular dial member positioned in front of a display field of a display, at least partly surrounding the display field, and traveling linearly across the display field wherein a movable member connected to the circular dial member is driven by a power source, the power source being coupled to a support member through a damper.

2. The vehicle display device according to claim 1, wherein the damper includes a vibration damping steel plate.

3. The vehicle display device according to claim 1, wherein the damper is made of synthetic resin-based material, and is sandwiched between a driving base on which the power source is mounted and the support member.

4. The vehicle display device according to claim 1, wherein the display comprises a display body having the display field, and a pair of radiators each connected along an outer edge of the display body, and wherein the vehicle display device further includes a front case positioned in front of the display, and a rear case positioned behind the power source, covering the display body together with the front case, and wherein the rear case includes a notch for at least one of the radiators passing the therethrough, and a sealing member arranged along an peripheral edge of the notch and held in contact with the display body.

5. The vehicle display device according to claim 1, further including a transmission device coupled to the support member through the damper, and configured to transmit driving force generated by the power source into the movable member.

6. The vehicle display device according to claim 5, wherein the transmission device is a gear-type one, and includes a helical gear to which the driving force is initially transmitted from the power source.

7. The vehicle display device according to claim 5, wherein the transmission device comprises a rack and pinion set configured to convert turning of the power source into linear travel, and in turn to transmit the linear travel to the movable member, the rack meshing with a torque limiter having static frictional force of lower torque than turning torque of the power source.

8. The vehicle display device according to claim 1, further including a pair of stoppers each having a buffer and being able to come in contact with an interlocking member to control moving range of the movable member, the interlocking member traveling together with the movable member and positioned between two stoppers.

9. The vehicle display device according to claim 8, wherein each of the stoppers includes a main body formed of synthetic resin-based material and the buffer formed of thermosetting elastomer-based material.

10. The vehicle display device, comprising:
a circular dial member positioned in front of a display field of a display, at least partly surrounding the display field, and traveling linearly across the display field wherein a movable member movably supported by a support member and connected to the circular dial member is driven by a power source; and
a transmission device coupled to the support member, transmitting the driving force generated by the power source into the movable member, and comprising a belt to which the driving force is initially transmitted,
the power source being coupled to the support member through a buffer-containing damper, the buffer being sandwiched between the power source and the support member in cases where the power source is fixed to the support member.

* * * * *